United States Patent
Schaefer et al.

(10) Patent No.: US 12,359,340 B2
(45) Date of Patent: Jul. 15, 2025

(54) KINETIC MODEL FOR MOLECULAR BEAM EPITAXY GROWTH OF III-V BISMIDE ALLOYS

(71) Applicants: Stephen T. Schaefer, Tempe, AZ (US); Marko S. Milosavljevic, Phoenix, AZ (US); Rajeev Reddy Kosireddy, Tempe, AZ (US); Shane R. Johnson, Chandler, AZ (US)

(72) Inventors: Stephen T. Schaefer, Tempe, AZ (US); Marko S. Milosavljevic, Phoenix, AZ (US); Rajeev Reddy Kosireddy, Tempe, AZ (US); Shane R. Johnson, Chandler, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 379 days.

(21) Appl. No.: 17/552,524

(22) Filed: Dec. 16, 2021

(65) Prior Publication Data
US 2022/0267924 A1    Aug. 25, 2022

Related U.S. Application Data

(60) Provisional application No. 63/126,229, filed on Dec. 16, 2020.

(51) Int. Cl.
| | |
|---|---|
| C30B 23/02 | (2006.01) |
| C22C 28/00 | (2006.01) |
| C23C 14/14 | (2006.01) |
| C23C 14/22 | (2006.01) |
| C23C 14/54 | (2006.01) |
| C30B 29/52 | (2006.01) |

(52) U.S. Cl.
CPC .............. *C30B 23/02* (2013.01); *C22C 28/00* (2013.01); *C23C 14/14* (2013.01); *C23C 14/221* (2013.01); *C23C 14/548* (2013.01); *C30B 29/52* (2013.01)

(58) Field of Classification Search
CPC ..... C30B 23/00; C30B 23/002; C30B 23/005; C30B 23/02; C30B 29/00; C30B 29/10; C30B 29/40; C30B 29/52; C23C 28/00; C23C 14/06; C23C 14/0617; C23C 14/14; C23C 14/22; C23C 14/221; C23C 14/24; C23C 14/54; C23C 14/548
USPC ...... 117/84, 88–89, 102–103, 105, 108, 937, 117/939
See application file for complete search history.

(56) References Cited

PUBLICATIONS

Schaefer, et al. publication entitled "Molecular beam epitaxy growth and optical properties of InAsSbBi," J. Appl. Phys., vol. 126, p. 083101 (2019). (Year: 2019).*

(Continued)

*Primary Examiner* — Kenneth A Bratland, Jr.
(74) *Attorney, Agent, or Firm* — Riverside Law LLP

(57) ABSTRACT

The invention relates in part to a growth model for the growth of Group III-Group V (III-V) alloys by molecular beam epitaxy (MBE) based on the kinetics of adsorption, desorption, incorporation, anion exchange, anion-assisted removal, and surface droplet accumulation of the Group V elements. The invention also relates to methods to optimize MBE growth conditions used to produce a target III-V alloy composition. The invention is further related to methods of predicting III-V alloy compositions resulting from a set of MBE growth conditions.

8 Claims, 13 Drawing Sheets

(56) References Cited

PUBLICATIONS

Tait, et al. publication entitled "Kinetics of droplet formation and Bi incorporation in GaSbBi alloys," J. Appl. Phys. Vol. 119, p. 215302 (2016). (Year: 2016).*

A. J. Shalindar, P. T. Webster, B. J. Wilkens, T. L. Alford, and S. R. Johnson, "Measurement of InAsBi mole fraction and InBi lattice constant using Rutherford backscattering spectrometry and X-ray diffraction", J. Appl. Phys. 120, 145704 (2016).

A. Y. Cho, "Growth of III-V semiconductors by molecular beam epitaxy and their properties", Thin Film Solids 100, 291-317 (1983).

C. B. Alcock, V. P. Itkin, and M. K. Horrigan, "Vapour pressure equations for the metallic elements: 298-2500K", Canadian Metallurgical Quarterly 23, 309 (1984).

C. R. Tait and J. M. Millunchick, "Kinetics of droplet formation and Bi incorporation in GaSbBi alloys", J. Appl. Phys. 119, 215302 (2016).

D. Souri and Z. E. Tahan, "A new method for the determination of optical band gap and the nature of optical transitions in semiconductors", Appl. Phys. B 119, 273-279 (2015).

E. C. Young, S. Tixier, and T. Tiedje, "Bismuth surfactant growth of the dilute nitride GaNxAs1-x", J. Cryst. Growth 279, 316 (2005).

G. Vardar, S. W. Paleg, M. V. Warren, M. Kang, S. Jeon, and R. S. Goldman, "Mechanisms of droplet formation and Bi incorporation during molecular beam epitaxy of GaAsBi", Appl. Phys. Lett. 102, 042106 (2013).

J. Meija, T. B. Coplen, M. Berglund, W. A. Brand, P. D. Bièvre, M. Gröning, N. E. Holden, J. Irrgeher, R. D. Loss, T. Walczyk, and T. Prohaska, "Atomic weights of the elements 2013 (IUPAC Technical Report)", Pure Appl. Chem. 88(3), 265-291 (2016).

J. W. Matthews and A. E. Blakeslee, "Defects in epitaxial multilayers: I. Misfit dislocations", J. Crystal Growth 27, 18-125 (1974).

L. C. Bannow, O. Rubel, S. C. Badescu, P. Rosenow, J. Hader, J. V. Moloney, R. Tonner, and S. W. Koch, "Configuration dependence of band gap narrowing and localization in dilute GaAs1-xBix alloys," Phys. Rev. B 93, 205202 (2016).

L. Viña, S. Logothetidis, and M. Cardona, "Temperature dependence of the dielectric function of germanium," Phys. Rev. B 30, 1979 (1984).

M. A. Berding, A. Sher, A. B. Chen, and W. E. Miller, "Structural properties of bismuth-bearing semiconductor alloys," J. Appl. Phys. 63, 107 (1988).

M. K. Rajpalke, W. M. Linhart, K. M. Yu, T. S. Jones, M. J. Ashwin, and T. D. Veal, "Bi flux-dependent MBE growth of GaSbBi alloys", J. Cryst. Growth 425, 241-244 (2015).

M. K. Rajpalke, W. M. Linhart, M. Birkett, K. M. Yu, J. Alaria, J. Kopaczek, R. Kudrawiec, T. S. Jones, M. J. Ashwin, and T. D. Veal, "High Bi content GaSbBi alloys", J. Appl. Phys. 116, 043511 (2014).

P. T. Webster, A. J. Shalindar, N. A. Riordan, C. Gogineni, H. Liang, A. R. Sharma, and S. R. Johnson, "Optical properties of InAsBi and optimal designs of lattice-matched and strain-balanced III-V semiconductor superlattices", J. Appl. Phys. 119, 225701 (2016).

P. T. Webster, A. J. Shalindar, S. T. Schaefer, and S. R. Johnson, "Bandgap and composition of bulk InAsSbBi grown by molecular beam epitaxy", Appl. Phys. Lett. 111, 082104 (2017).

P. T. Webster, N. A. Riordan, C. Gogineni, S. Liu, J. Lu, X.-H. Zhao, D. J. Smith, Y.-H. Zhang, and S. R. Johnson, "Molecular beam epitaxy using bismuth as a constituent in InAs and a surfactant in InAs/InAsSb superlattices", J. Vac. Sci. Technol. B 32(2), 02C120-1 (2014).

P. T. Webster, N. A. Riordan, S. Liu, E. H. Steenbergen, R. A. Synowicki, Y.-H. Zhang, and S. R. Johnson, "Absorption properties of type-II InAs/InAsSb superlattices measured by spectroscopic ellipsometry", Appl. Phys. Lett. 106, 061907 (2015).

P. T. Webster, N. A. Riordan, S. Liu, E. H. Steenbergen, R. A. Synowicki, Y.-H. Zhang, and S. R. Johnson, "Measurement of InAsSb bandgap energy and InAs/InAsSb band edge positions using spectroscopic ellipsometry and photoluminescence spectroscopy", J. Appl. Phys. 118, 245706 (2015).

R. B. Lewis, M. Masnadi-Shirazi, and T. Tiedje, "Growth of high Bi concentration GaAs1-xBix by molecular beam epitaxy," Appl. Phys. Lett. 101(8), 082112 (2012).

R. N. Kini, A. J. Ptak, B. Fluegel, R. France, R. C. Reedy, and A. Mascarenhas, "Effect of Bi alloying on the hole transport in the dilute bismide alloy GaAs1-xBix", Phys. Rev. B 83, 075307 (2011).

R. R. Kosireddy, S. T. Schaefer, A. J. Shalindar, and S. R. Johnson, "Microstructure and surface morphology of InAsSbBi grown by molecular beam epitaxy", J. Appl. Phys. 126, 095108 (2019).

S. Francoeur, S. Tixier, E. Young, T. Tiedje, and A. Mascarenhas, "Bi isoelectronic impurities in GaAs", Phys. Rev. B 77, 085209 (2008).

S. R. Johnson and T. Tiedje, "Temperature dependence of the Urbach edge in GaAs", J. Appl. Phys. 78, 5609 (1995).

S. T. Schaefer, R. R. Kosireddy, P. T. Webster, and S. R. Johnson, "Molecular beam epitaxy growth and optical properties of InAsSbBi", J. Appl. Phys. 126, 083101 (2019).

S. Tixier, M. Adamcyk, T. Tiedje, S. Francoeur, A. Mascarenhas, P. Wei, and F. Schiettekatte, "Molecular beam epitaxy growth of GaAs1-xBix", Appl. Phys. Lett. 82, 2245 (2003).

T. M. Christian, K. Alberi, D. A. Beaton, B. Fluegel, and A. Mascarenhas, "Spectrally resolved localized states in GaAs1-xBix", Japanese J. Appl. Phys. 56, 035801 (2017).

X. Lu, D. A. Beaton, R. B. Lewis, T. Tiedje, and M. B. Whitwick, "Effect of molecular beam epitaxy growth conditions on the Bi content of GaAs1-xBix," Appl. Phys. Lett. 92(19), 192110 (2008).

Y. Horikoshi, M. Kawashima, and H. Yamaguchi, "Migration-enhanced epitaxy of GaAs and AlGaAs", Jap. J. Appl. Phys. 27, 169-179 (1988).

* cited by examiner

KINETIC MODEL FOR MOLECULAR BEAM EPITAXY GROWTH OF III-V BISMIDE ALLOYS

CROSS REFERENCE TO RELATED APPLICATIONS

This application claims the benefit of U.S. Provisional Patent Application No. 63/126,229, filed on Jul. 16, 2020, which is incorporated by reference herein in its entirety.

STATEMENT REGARDING FEDERALLY SPONSORED RESEARCH OR DEVELOPMENT

This invention was made with government support under Grant No. FA9453-19-2-0004 awarded by the Air Force Research Laboratory. The Government has certain rights in the invention.

BACKGROUND OF THE INVENTION

Bismuth-containing III-V semiconductor alloys have received considerable attention as materials for optoelectronic devices operating in the mid- and long-wave infrared spectrum. The infrared spectrum finds important applications in both commerce and government, including medical imaging and diagnostics, autonomous vehicle sensors, telecommunications, and gas sensing among others. The quaternary alloy InAsSbBi grown on readily available large-area GaSb substrates (Schaefer et al., J. Appl. Phys. 126, 083101 (2019) and Webster, et al, Appl. Phys. Lett. 111, 082104 (2017)) is particularly attractive for these applications as it offers highly-tunable bandgaps ranging from 0.324 to 0.104 eV (3.8 to 11.9 μm) at low temperature (for example, about −260° C.) and 0.277 to 0.048 eV (4.5 to 25.8 μm) at room temperature (~23° C.). Moreover, bismuth is the largest stable element and is relatively nontoxic and abundant compared to other nearby heavy elements such as lead, thallium, or mercury.

InAsSbBi is a highly mismatched alloy with isoelectronic group V elements of different sizes, ionicities, and electronegativities. Highly mismatched alloys can have miscibility gaps (Berding et al., J. Appl. Phys. 63, 107 (1988)) over certain composition ranges that make them challenging to grow. Molecular beam epitaxy is a non-equilibrium technique well-suited to growth of bismide alloys, which exhibit a strong tendency for surface segregation and composition modulation (Tait et al., J. Appl. Phys. 119, 215302 (2016); Kosireddy et al., J. Appl. Phys. 126, 095108 (2019); Webster et al., J. Vac. Sci. Technol. B 32(2), 02C120-1 (2014); Rajpalke et al., J. Cryst. Growth 425, 241-244 (2015); Tixier et al., Appl. Phys. Lett. 82, 2245 (2003)) due to the very low solid solubility of Bi in host materials such as GaSb or InAs (Ma et al., J. Cryst. Growth 107, 416-421 (1991)). Despite its wide use throughout research and production, the impact of molecular beam epitaxy growth conditions on chemical composition is not well understood. It is important to develop a comprehensive model for molecular beam epitaxy growth of bismide alloys to predict the outcome of growth experiments and guide the selection of growth temperatures and group V element:Indium flux ratios (V/In flux ratios) to maximize Bi incorporation. For example, when InAsSbBi is grown at the relatively low temperature of 280° C., the Bi incorporation coefficient, which is defined as the fraction of incident Bi flux that incorporates into the film, is known to be near unity (Webster et al., Appl. Phys. Lett. 111, 082104 (2017)). However, low temperature grown InAsSbBi results in significantly reduced optical quality (Webster et al., Appl. Phys. Lett. 111, 082104 (2017)). By contrast, InAsSbBi grown at relatively high temperatures from 400° C. to 430° C. exhibits greatly improved optical performance, but with much smaller Bi incorporation coefficients that range from 1 to 10% (Schaefer, et al., J. Appl. Phys. 126, 083101 (2019)). Identification of V/In flux ratios for optimal Bi incorporation in the 400° C. to 430° C. temperature range is important in extending the optical performance further into the infrared spectrum.

Semi-empirical molecular beam epitaxy growth models have been successfully applied to dilute bismide alloys such as GaAsBi and GaSbBi. Lu et al. (Appl. Phys. Lett. 92(19), 192110 (2008)) developed a three-term growth model for GaAsBi which accounts for the rates of formation of As—Ga—Bi bonds, Ga—Bi bonds, and displacement of Bi from Ga—Bi bonds by As. A key concept in this model is the presence of a Bi surface coverage layer that is described by a Langmuir isotherm (Young et al., J. Cryst. Growth 279, 316 (2005)) and serves as a reservoir from which Bi can incorporate into the crystal termination layer. Lewis et al. (Appl. Phys. Lett. 101(8), 082112 (2012)) expanded on this concept, recasting the problem in terms of the Ga/Bi ratio on the surface of the growing crystal. While both models succeed in predicting Bi mole fraction in GaAsBi across a range of Bi/Ga and As/Ga flux ratios, they do not include the influence of other mechanisms such as As-assisted desorption of Bi and are not straightforwardly extended to include the influence of a third group-V element such as Sb. Furthermore, these models do not address the commonly observed formation of Bi-rich droplet features (Schaefer, et al., J. Appl. Phys. 126, 083101 (2019); Tait et al., J. Appl. Phys. 119, 215302 (2016); Kosireddy et al., J. Appl. Phys. 126, 095108 (2019); Webster et al., J. Vac. Sci. Technol. B 32(2), 02C120-1 (2014); Rajpalke et al., J. Cryst. Growth 425, 241-244 (2015)). Tait et al. (J. Appl. Phys. 119, 215302 (2016)) considered these additional mechanisms by developing a six-term growth model which includes the mechanisms of Bi adsorption, desorption, anion-assisted displacement of Bi from the crystal termination layer, anion-assisted removal of Bi from the surface, and Bi-rich droplet accumulation. This model provides an estimate of the Bi mole fraction in GaSbBi alloys and accounts for the process of droplet formation. Furthermore, it is readily extendable to growth of other bismide III-V ternary alloys such as GaAsBi and InAsBi and to quaternary alloys such as GaAsSbBi and InAsSbBi.

SUMMARY OF THE INVENTION

The growth of Bi-containing III-V alloys requires careful control over temperature and group V fluxes due to the low equilibrium solubility of Bi and its tendency to surface segregate into Bi-rich droplet features. A model for molecular beam epitaxy growth based on the kinetics of atomic desorption, incorporation, surface accumulation, and droplet formation is applied to the bismide alloy InAsSbBi grown on GaSb substrates. A steady state solution is derived for the Bi, Sb, and As mole fractions and surface layer coverages based on the Bi, Sb, and As fluxes. A nonlinear least-squares algorithm is used to fit the growth model parameters to experimentally measured Bi mole fractions in bulk and quantum well InAsSbBi samples grown at 400° C. and 420° C. The Bi mole fraction ranges from 0.12% to 1.86% among 17 samples examined. The results indicate that as the growth temperature increases, the rate of Bi incorporation decreases and the rate of Bi self-desorption increases. A strong interaction is observed between Bi and As that plays a role in the desorption of excess Bi from the growth surface, thus reducing the likelihood of Bi-rich droplet formation when an excess As flux is present. Significantly, the model predicts that the incorporation of Bi is limited to mole fractions of 1.43% at 400° C. and 0.30% at 420° C. in lattice-matched bulk InAsSbBi grown on GaSb substrates.

Some embodiments of the invention disclosed herein are set forth below, and any combination of these embodiments (or portions thereof) may be made to define another embodiment.

In a first aspect of the invention, there is provided a method to optimize molecular beam epitaxy (MBE) growth conditions used to produce a target III-V alloy composition, wherein a quaternary III-V alloy composition is described by Group V element mole fractions, x, y, and z and surface coverages, $\theta_x$, $\theta_y$, and $\theta_z$, respectively, for Group V elements X, Y and Z, the method comprising:
- selecting MBE operator controllable inputs, said inputs including one or more growth temperature and incident Group III and Group V fluxes, $F_{III}$, $F_x$, $F_y$, and $F_z$, respectively, or flux ratios, $F_x/F_{III}$, $F_y/F_{III}$, and $F_z/F_{III}$, respectively;
- obtaining estimates of model growth parameters for x, y and z, which model growth parameters include element X desorption rate, incorporation rate, droplet accumulation rate, probabilities of element Y- and Z-assisted exchange, and probabilities of element Y- and Z-assisted removal, as well as analogous model growth parameters for element Y and element Z;
- calculating experimentally derived inputs, including the Group V element mole fractions x, y, and z of the alloys and the excess flux ratios for the group V elements, $\Delta F_x$, $\Delta F_y$, and $\Delta F_z$, respectively;
- performing iterative calculations to derive Group V mole fractions, x, y, and z, and Group V element surface coverages, $\theta_x$, $\theta_y$ and $\theta_z$, via equations that relate the steady-state element X surface coverage fraction, $\theta_x$, and the bulk mole fraction, x, to the group III and group V fluxes through the model parameters for x, as well as an analogous set of equations relating the steady-state element Y and element Z surface coverage fractions, $\theta_y$, and $\theta_z$, and the bulk mole fractions, y, and z, to the group III and group V fluxes through the model parameters for y and z;
- and identifying those group V fluxes $F_x$, $F_y$, and $F_z$ which result in the targeted group V mole fractions x, y, and z;
- wherein the method further applies to a ternary III-V alloy composition having no element Z and is described similarly but without the terms associated with z; and further wherein the method further applies to a higher III-V alloy composition and is described similarly but with additional terms p, q and so on for additional Group V elements P, Q and so on as required for higher III-V alloy compositions.

In an embodiment, the equation that relates to the steady-state element X surface coverage fraction, $\theta_x$, is governed by the balance between mechanisms that increase the surface coverage and those that reduce it; wherein the terms that serve to increase the element X surface coverage fraction $\theta_x$ are the incident flux of X and the group V element Y- and Z-assisted exchange; and the terms that serve to decrease the element X surface coverage fraction are the rates of element X self-desorption, incorporation, and droplet accumulation, and the element Y- and Z-assisted removal of element X by the excess Y and Z fluxes; and wherein similar relationships exist for the steady-state element Y surface coverage fraction, $\theta_y$, and for the steady-state element Z surface coverage fraction, $\theta_z$.

In an embodiment, the equation that relates to the modeled element X mole fraction in the bulk crystal, x, is given by the sum of the rates of the incorporation and removal processes; wherein the product of the element X mole fraction and group III flux is equal to the element X incorporation rate, which is proportional to the element X surface coverage fraction, less the element Y- and Z-assisted exchange, which is proportional to element X mole fraction.

In an embodiment, the step of performing iterative calculations to derive Group V mole fractions, x, y, and z, and Group V element surface coverages, $\theta_x$, $\theta_y$ and $\theta_z$, via equations 3, 4 and 4a, or any other equation(s) derived from equations 3 and 4, that relate the steady-state element X surface coverage fraction, $\theta_x$, and the bulk mole fraction, x, to the group III and group V fluxes, $F_{III}$, $F_x$, $F_y$, and $F_z$, through the model parameters in the obtaining step, which equations 3, 4 and 4a are given by:

$$\theta_x = \frac{F_x(F_{III} + F_z P_{exc,z} + F_y P_{exc,y})}{(R_{des,x} + R_{dro,x} + \Delta F_z P_{rem,z} + \Delta F_y P_{rem,y}) + F_{III} R_{inc,x}}, \quad (3)$$

$$x = \frac{\theta_x R_{inc,x}}{(F_{III} + F_z P_{exc,z} + F_y P_{exc,y})}, \quad (4)$$

$$= \frac{F_x R_{inc,x}}{(F_{III} + F_z P_{exc,z} + F_y P_{exc,y})}; \quad (4a)$$
$$(R_{des,x} + R_{dro,x} + \Delta F_z P_{rem,z} + \Delta F_y P_{rem,y}) + F_{III} R_{inc,x}$$

as well as similar equations that exist for $\theta_y$ and mole fraction y by transposing components for y in place of x and vice-versa in the equations; and similar equations that exist for $\theta_z$ and mole fraction z by transposing components for z in place of x and vice-versa in the equations;
- wherein with respect to model growth parameters for x:
- $R_{des,x}$, $R_{inc,x}$ and $R_{dro,x}$ are the rates of self-desorption, incorporation and droplet accumulation, respectively, for Group V element X; and
- $P_{exc,y}$ and $P_{exc,z}$ are the probability that an atom of element Y or Z, respectively, displaces an atom of element X back into the surface layer; and
- $P_{rem,y}$ and $P_{rem,z}$ are the probability of anion-assisted removal of an atom of element X by an atom of element Y or Z, respectively; and where:
- with respect to model growth parameters for y:
- $R_{des,y}$, $R_{inc,y}$ and $R_{dro,y}$ are the rates of self-desorption, incorporation and droplet accumulation, respectively, for Group V element Y; and
- $P_{exc,x}$ and $P_{exc,z}$ are the probability that an atom of element X or Z, respectively, displaces an atom of element Y back into the surface layer; and
- $P_{rem,x}$ and $P_{rem,z}$ are the probability of anion-assisted removal of an atom of element Y by an atom of element X or Z, respectively; and where:
- with respect to model growth parameters for z:
- $R_{des,z}$, $R_{inc,z}$ and $R_{dro,z}$ are the rates of self-desorption, incorporation and droplet accumulation, respectively, for Group V element Z; and
- $P_{exc,x}$ and $P_{exc,y}$ are the probability that an atom of element X or Y, respectively, displaces an atom of element Z back into the surface layer; and $P_{rem,x}$ and $P_{rem,y}$ are the probability of anion-assisted removal of an atom of element Z by an atom of element X or Y, respectively; and further wherein the method further applies to a ternary III-V alloy composition having no element Z and is described similarly but without the terms associated with z; and further wherein the method further applies to a higher III-V alloy composition and is described similarly but with additional terms p, q and so on for additional Group V elements P, Q and so on as required for higher III-V alloy compositions.

In an embodiment, the step of obtaining estimates of the model parameters in the obtaining step comprises performing MBE growths of III-V alloys using operator controllable inputs, and measuring droplet accumulation rate, $\theta_x R_{dro,x}$, for each growth that exhibits surface droplet formation of element X.

In an embodiment, the of obtaining estimates of the model parameters in the obtaining step comprises performing MBE growths of III-V alloys using operator controllable inputs, and performing experimental determination of alloy lattice constants and band gap energies for each growth.

In an embodiment, the step of performing the experimental determination of alloy lattice constants for each growth is ascertained, at least for some portion of the Group V elements, from X-ray diffraction measurements.

In an embodiment, the step of performing the experimental determination of band gap energies for each growth is ascertained, at least for some portion of the Group V elements, from steady state photoluminescence spectroscopy measurements.

In an embodiment, the step of performing the experimental determination of measured droplet accumulation rate, $\theta_x R_{dro}$, for each growth is ascertained, at least for some portion of the Group V elements, from X-ray diffraction measurements of growth layer thickness.

In an embodiment, the Group V element mole fractions x, y, and z of the alloys are derived from the alloy lattice constants and band gap energies using Vegard's law and an alloy bandgap bowing model.

In an embodiment, the excess flux ratios for the Group V elements are calculated as the difference between the incident Group V flux ratios and the derived Group V element mole fractions x, y, and z of the alloys.

In an embodiment, the III-V alloy comprises Ga or In, and one or more of Bi, Sb or As.

In an embodiment, the III-V alloy is GaSbBi, GaAsBi, InSbBi, InAsBi, GaAsSbBi, or InAsSbBi.

In an embodiment, the III-V alloy is InAsSbBi.

In another aspect of the invention, there is provided a method to predict a III-V alloy composition produced by molecular beam epitaxy (MBE), wherein a quaternary III-V alloy composition is described by Group V element mole fractions, x, y, and z and surface coverages, $\theta_x$, $\theta_y$, and $\theta_z$, respectively, for Group V elements X, Y and Z, the method comprising:

selecting MBE operator controllable inputs, said inputs including one or more growth temperature and incident Group III and Group V fluxes, $F_{III}$, $F_x$, $F_y$, and $F_z$, respectively, or flux ratios, $F_x/F_{III}$, $F_y/F_{III}$, and $F_z/F_{III}$, respectively;

obtaining estimates of model growth parameters for x, y and z, which model growth parameters include element X desorption rate, incorporation rate, droplet accumulation rate, probabilities of element Y- and Z-assisted exchange, and probabilities of element Y- and Z-assisted removal, as well as analogous model growth parameters for element Y and element Z;

calculating experimentally derived inputs, including the Group V element mole fractions x, y, and z of the alloys and the excess flux ratios for the group V elements, $\Delta F_x$, $\Delta F_y$, and $\Delta F_z$, respectively;

performing iterative calculations to derive Group V mole fractions, x, y, and z, and Group V element surface coverages, $\theta_x$, $\theta_y$ and $\theta_z$ via equations that relate the steady-state element X surface coverage fraction, $\theta_x$, and the bulk mole fraction, x, to the group III and group V fluxes through the model parameters for x, as well as an analogous set of equations relating the steady-state element Y and element Z surface coverage fractions, $\theta_y$, and $\theta_z$, and the bulk mole fractions, y, and z, to the group III and group V fluxes through the model parameters for y and z;

and mapping a variety of potential input parameters to projected resulting Group V element mole fractions, x, y, and z and surface coverages, $\theta_x$, $\theta_y$ and $\theta_z$, using the iterative calculations, wherein the III-V alloy composition predicted by the model is embodied by the Group V element mole fractions, x, y, and z;

wherein the method further applies to a ternary III-V alloy composition having no element Z and is described similarly but without the terms associated with z; and further wherein the method further applies to a higher III-V alloy composition and is described similarly but with additional terms p, q and so on for additional Group V elements P, Q and so on as required for higher III-V alloy compositions.

In another aspect of the invention, there is provided a method to minimize Group III- or Group V-rich surface droplets in a III-V alloy composition produced by molecular beam epitaxy (MBE), wherein a quaternary III-V alloy composition is described by Group V element mole fractions, x, y, and z and surface coverages, $\theta_x$, $\theta_y$, and $\theta_z$, respectively, for Group V elements X, Y and Z, the method comprising:

selecting MBE operator controllable inputs, said inputs including one or more growth temperature and incident Group III and Group V fluxes, $F_{III}$, $F_x$, $F_y$, and $F_z$, respectively, or flux ratios, $F_x/F_{III}$, $F_y/F_{III}$, and $F_z/F_{III}$, respectively;

obtaining estimates of model growth parameters for x, y and z, which model growth parameters include element X desorption rate, incorporation rate, droplet accumulation rate, probabilities of element Y- and Z-assisted exchange, and probabilities of element Y- and Z-assisted removal, as well as analogous model growth parameters for element Y and element Z;

calculating experimentally derived inputs, including the Group V element mole fractions x, y, and z of the alloys and the excess flux ratios for the group V elements, $\Delta F_x$, $\Delta F_y$, and $\Delta F_z$, respectively;

performing iterative calculations to derive Group V mole fractions, x, y, and z, and Group V element surface coverages, $\theta_x$, $\theta_y$ and $\theta_z$ via equations that relate the steady-state element X surface coverage fraction, $\theta_x$, and the bulk mole fraction, x, to the group III and group V fluxes through the model parameters for x, as well as an analogous set of equations relating the steady-state element Y and element Z surface coverage fractions, $\theta_y$, and $\theta_z$, and the bulk mole fractions, y, and z, to the group III and group V fluxes through the model parameters for y and z; and mapping a variety of potential input parameters to projected resulting Group V element mole fractions, x, y, and z and surface coverages, $\theta_x$, $\theta_y$ and $\theta_z$, using the iterative calculations, in order to identify conditions that minimize the formation of surface droplets, which conditions include maintaining the excess flux ratio(s) of one or more of the Group V elements x, y, and z above a critical threshold required for droplet free growth at the specified growth temperature;

wherein the method further applies to a ternary III-V alloy composition having no element Z and is described similarly but without the terms associated with z; and further wherein the method further applies to a higher III-V alloy composition and is described similarly but with additional terms p, q and so on for additional Group V elements P, Q and so on as required for higher III-V alloy compositions.

In another aspect of the invention, there is provided a method to optimize molecular beam epitaxy (MBE) growth conditions used to produce a target InAsSbBi alloy composition, wherein the InAsSbBi composition is described by mole fractions of Bi, Sb and As, respectively x, y, and z, and surface coverages of Bi, Sb and As, respectively $\theta_{Bi}$, $\theta_{Sb}$, and $\theta_{As}$, the method comprising:

selecting MBE operator controllable inputs, said inputs including one or more growth temperature and incident In, Bi, Sb and As fluxes, $F_{In}$, $F_{Bi}$, $F_{Sb}$, and $F_{As}$, or flux ratios, $F_{Bi}/F_{III}$, $F_{Sb}/F_{III}$, and $F_{As}/F_{III}$, respectively;

obtaining estimates of model growth parameters for Bi including $R_{des,Bi}$, $R_{inc,Bi}$, $R_{dro,Bi}$, $P_{exc,Sb}$, $P_{exc,As}$, $P_{rem,Sb}$, and $P_{rem,As}$ and estimates of model growth parameters for Sb including $R_{des,Sb}$, $R_{inc,Sb}$, $R_{dro,Sb}$, $P_{exc,Bi}$, $P_{exc,As}$, $P_{rem,Bi}$, and $P_{rem,As}$ and estimates of model growth parameters for As including $R_{des,As}$, $R_{inc,As}$, $R_{dro,As}$, $P_{exc,Bi}$, $P_{exc,Sb}$, $P_{rem,Bi}$, and $P_{rem,Sb}$;

calculating experimentally derived inputs, including the Bi, Sb and As mole fractions, x, y, and z, of the alloys and the excess flux ratios for Bi, Sb and As, $\Delta F_{Bi}$, $\Delta F_{Sb}$ and $\Delta F_{As}$, respectively;

performing iterative calculations using equations 3 and 4, or equation 4a or any other equation(s) derived from equations 3 and 4, to calculate mole fractions of Bi, Sb and As, x, y, and z, respectively, and surface coverages of Bi, Sb and As, respectively, $\theta_{Bi}$, $\theta_{Sb}$ and $\theta_{As}$, and identifying those Bi, Sb, and As fluxes, $F_{Bi}$, $F_{Sb}$, and $F_{As}$, which result in the targeted Bi, Sb, and As mole fractions, x, y, and z;

wherein equations 3, 4 and 4a are given by:

$$\theta_{Bi} = \frac{F_{Bi}(F_{In} + F_{As}P_{exc,As} + F_y P_{exc,Sb})}{\begin{matrix}(F_{In} + F_{As}P_{exc,As} + F_{Sb}P_{exc,Sb}) \\ (R_{des,Bi} + R_{dro,Bi} + \Delta F_{As}P_{rem,As} + \Delta F_{Sb}P_{rem,Sb}) + F_{In}R_{inc,Bi}\end{matrix}}, \quad (3)$$

$$x = \frac{\theta_{Bi}R_{inc,Bi}}{(F_{In} + F_{As}P_{exc,As} + F_{Sb}P_{exc,Sb})}, \quad (4)$$

$$= \frac{F_{Bi}R_{inc,Bi}}{\begin{matrix}(F_{In} + F_{As}P_{exc,As} + F_{Sb}P_{exc,Sb}) \\ (R_{des,Bi} + R_{dro,Bi} + \Delta F_{As}P_{rem,As} + \Delta F_{Sb}P_{rem,Sb}) + F_{In}R_{inc,Bi}\end{matrix}}. \quad (4a)$$

where $R_{des,Bi}$, $R_{inc,Bi}$ and $R_{dro,Bi}$ are the rates of self-desorption, incorporation and droplet accumulation, respectively, for Bi;

$R_{des,Sb}$, $R_{inc,Sb}$ and $R_{dro,Sb}$ are the rates of self-desorption, incorporation and droplet accumulation, respectively, for Sb;

$R_{des,As}$, $R_{inc,As}$ and $R_{dro,As}$ are the rates of self-desorption, incorporation and droplet accumulation, respectively, for As;

$P_{exc,Sb}$ and $P_{exc,As}$ are the probability that an atom of Sb or As, respectively, displaces an atom of Bi back into the surface layer;

$P_{exc,Bi}$ and $P_{exc,As}$ are the probability that an atom of Bi or As, respectively, displaces an atom of Sb back into the surface layer;

$P_{exc,Bi}$ and $P_{exc,Sb}$ are the probability that an atom of Bi or Sb, respectively, displaces an atom of As back into the surface layer;

$P_{rem,Sb}$ and $P_{rem,As}$ are the probability of anion-assisted removal of an atom of Bi by an atom of element Sb or As, respectively;

$P_{rem,Bi}$ and $P_{rem,As}$ are the probability of anion-assisted removal of an atom of Sb by an atom of element Bi or As, respectively; and $P_{rem,Bi}$ and $P_{rem,Sb}$ are the probability of anion-assisted removal of an atom of As by an atom of element Bi or Sb, respectively; and wherein similar equations exist for $\theta_{Sb}$ and mole fraction y by transposing components for y in place of x and vice-versa in the equations; and similar equations exist for $\theta_{As}$ and mole fraction z by transposing components for z in place of x and vice-versa in the equations. The growth conditions identified by the calculation, i.e., the Bi, Sb and As fluxes, may be used to produce the target alloy.

In another aspect of the invention, there is provided a method to predict a InAsSbBi alloy composition produced by molecular beam epitaxy (MBE), wherein the InAsSbBi composition is described by mole fractions of Bi, Sb and As, respectively x, y, and z, and surface coverages of Bi, Sb and As, respectively $\theta_{Bi}$, $\theta_{Sb}$, and $\theta_{As}$, the method comprising:

selecting MBE operator controllable inputs, said inputs including one or more growth temperature and incident In, Bi, Sb and As fluxes, $F_{In}$, $F_{Bi}$, $F_{Sb}$, and $F_{As}$, or flux ratios, $F_{Bi}/F_{III}$, $F_{Sb}/F_{III}$, and $F_{As}/F_{III}$, respectively;

obtaining estimates of model growth parameters for Bi including $R_{des,Bi}$, $R_{inc,Bi}$, $R_{dro,Bi}$, $P_{exc,Sb}$, $P_{exc,As}$, $P_{rem,Sb}$, and $P_{rem,As}$ and estimates of model growth parameters for Sb including $R_{des,Sb}$, $R_{inc,Sb}$, $R_{dro,Sb}$, $P_{exc,Bi}$, $P_{exc,As}$, $P_{rem,Bi}$, and $P_{rem,As}$ and estimates of model growth parameters for As including $R_{des,As}$, $R_{inc,As}$, $R_{dro,As}$, $P_{exc,Bi}$, $P_{exc,Sb}$, $P_{rem,Bi}$, and $P_{rem,Sb}$;

calculating experimentally derived inputs, including the Bi, Sb and As mole fractions, x, y, and z, of the alloys and the excess flux ratios for Bi, Sb and As, $\Delta F_{Bi}$, $\Delta F_{Sb}$ and $\Delta F_{As}$, respectively;

performing iterative calculations using equations 3 and 4, or equation 4a or any other equation(s) derived from equations 3 and 4, to calculate mole fractions of Bi, Sb and As, x, y, and z, respectively, and surface coverages of Bi, Sb and As, respectively, $\theta_{Bi}$, $\theta_{Sb}$ and $\theta_{As}$, and mapping a variety of potential input parameters to projected resulting Group V element mole fractions, x, y, and z and surface coverages, $\theta_x$, $\theta_y$ and $\theta_z$, using the iterative calculations, wherein the InAsSbBi alloy composition predicted by the model is embodied by the Group V element mole fractions, x, y, and z;

wherein equations 3, 4 and 4a are given by:

$$\theta_{Bi} = \frac{F_{Bi}(F_{In} + F_{As}P_{exc,As} + F_{Sb}P_{exc,Sb})}{\begin{matrix}(F_{In} + F_{As}P_{exc,As} + F_{Sb}P_{exc,Sb}) \\ (R_{des,Bi} + R_{dro,Bi} + \Delta F_{As}P_{rem,As} + \Delta F_{Sb}P_{rem,Sb}) + F_{In}R_{inc,Bi}\end{matrix}}, \quad (3)$$

-continued $$x = \frac{\theta_{Bi} R_{inc,Bi}}{(F_{In} + F_{As}P_{exc,As} + F_{Sb}P_{exc,Sb})}, \quad (4)$$

$$= \frac{F_{Bi} R_{inc,Bi}}{(R_{des,Bi} + R_{dro,Bi} + \Delta F_{As}P_{rem,As} + \Delta F_{Sb}P_{rem,Sb}) + F_{In}R_{inc,Bi}}. \quad (4a)$$

where $R_{des,Bi}$, $R_{inc,Bi}$ and $R_{dro,Bi}$ are the rates of self-desorption, incorporation and droplet accumulation, respectively, for Bi;

$R_{des,Sb}$, $R_{inc,Sb}$ and $R_{dro,Sb}$ are the rates of self-desorption, incorporation and droplet accumulation, respectively, for Sb;

$R_{des,As}$, $R_{inc,As}$ and $R_{dro,As}$ are the rates of self-desorption, incorporation and droplet accumulation, respectively, for As;

$P_{exc,Sb}$ and $P_{exc,As}$ are the probability that an atom of Sb or As, respectively, displaces an atom of Bi back into the surface layer;

$P_{exc,Bi}$ and $P_{exc,As}$ are the probability that an atom of Bi or As, respectively, displaces an atom of Sb back into the surface layer;

$P_{exc,Bi}$ and $P_{exc,Sb}$ are the probability that an atom of Bi or Sb, respectively, displaces an atom of As back into the surface layer;

$P_{rem,Sb}$ and $P_{rem,As}$ are the probability of anion-assisted removal of an atom of Bi by an atom of element Sb or As, respectively;

$P_{rem,Bi}$ and $P_{rem,As}$ are the probability of anion-assisted removal of an atom of Sb by an atom of element Bi or As, respectively; and $P_{rem,Bi}$ and $P_{rem,Sb}$ are the probability of anion-assisted removal of an atom of As by an atom of element Bi or Sb, respectively; and wherein similar equations exist for $\theta_{Sb}$ and mole fraction y by transposing components for y in place of x and vice-versa in the equations; and similar equations exist for $\theta_{As}$ and mole fraction z by transposing components for z in place of x and vice-versa in the equations.

In another aspect of the invention, there is provided a method to minimize bismuth-rich surface droplets in a InAsSbBi alloy composition produced by molecular beam epitaxy (MBE), wherein the InAsSbBi composition is described by mole fractions of Bi, Sb and As, respectively x, y, and z, and surface coverages of Bi, Sb and As, respectively $\theta_{Bi}$, $\theta_{Sb}$, and $\theta_{As}$, the method comprising:

selecting MBE operator controllable inputs, said inputs including one or more growth temperature and incident In, Bi, Sb and As fluxes, $F_{In}$, $F_{Bi}$, $F_{Sb}$, and $F_{As}$, or flux ratios, $F_{Bi}/F_{III}$, $F_{Sb}/F_{III}$, and $F_{As}/F_{III}$, respectively;

obtaining estimates of model growth parameters for Bi including $R_{des,Bi}$, $R_{inc,Bi}$, $R_{dro,Bi}$, $P_{exc,Sb}$, $P_{exc,As}$, $P_{rem,Sb}$, and $P_{rem,As}$ and estimates of model growth parameters for Sb including $R_{des,Sb}$, $R_{inc,Sb}$, $R_{dro,Sb}$, $P_{exc,Bi}$, $P_{exc,As}$, $P_{rem,Bi}$, and $P_{rem,As}$ and estimates of model growth parameters for As including $R_{des,As}$, $R_{inc,As}$, $R_{dro,As}$, $P_{exc,Bi}$, $P_{exc,Sb}$, $P_{rem,Bi}$, and $P_{rem,Sb}$;

calculating experimentally derived inputs, including the Bi, Sb and As mole fractions, x, y, and z, of the alloys and the excess flux ratios for Bi, Sb and As, $\Delta F_{Bi}$, $\Delta F_{Sb}$ and $\Delta F_{As}$, respectively;

performing iterative calculations using equations 3 and 4, or equation 4a or any other equation(s) derived from equations 3 and 4, to calculate mole fractions of Bi, Sb and As, x, y, and z, respectively, and surface coverages of Bi, Sb and As, respectively, $\theta_{Bi}$, $\theta_{Sb}$ and $\theta_{As}$; and mapping a variety of potential input parameters to projected resulting Group V element mole fractions, x, y, and z and surface coverages, $\theta_x$, $\theta_y$ and $\theta_z$, using the iterative calculations, in order to identify conditions that minimize the formation of surface droplets, which conditions include maintaining the excess flux ratio of As, $\Delta F_{As}$, above the minimum excess As flux, $\Delta F_{DF}$, required for droplet free growth at the specified growth temperature;

wherein equations 3, 4 and 4a are given by:

$$\theta_{Bi} = \frac{F_{Bi}(F_{In} + F_{As}P_{exc,As} + F_{Sb}P_{exc,Sb})}{(F_{In} + F_{As}P_{exc,As} + F_{Sb}P_{exc,Sb})(R_{des,Bi} + R_{dro,Bi} + \Delta F_{As}P_{rem,As} + \Delta F_{Sb}P_{rem,Sb}) + F_{In}R_{inc,Bi}}, \quad (3)$$

$$x = \frac{\theta_{Bi} R_{inc,Bi}}{(F_{In} + F_{As}P_{exc,As} + F_{Sb}P_{exc,Sb})}, \quad (4)$$

$$= \frac{F_{Bi} R_{inc,Bi}}{(R_{des,Bi} + R_{dro,Bi} + \Delta F_{As}P_{rem,As} + \Delta F_{Sb}P_{rem,Sb}) + F_{In}R_{inc,Bi}}. \quad (4a)$$

where $R_{des,Bi}$, $R_{inc,Bi}$ and $R_{dro,Bi}$ are the rates of self-desorption, incorporation and droplet accumulation, respectively, for Bi;

$R_{des,Sb}$, $R_{inc,Sb}$ and $R_{dro,Sb}$ are the rates of self-desorption, incorporation and droplet accumulation, respectively, for Sb;

$R_{des,As}$, $R_{inc,As}$ and $R_{dro,As}$ are the rates of self-desorption, incorporation and droplet accumulation, respectively, for As;

$P_{exc,Sb}$ and $P_{exc,As}$ are the probability that an atom of Sb or As, respectively, displaces an atom of Bi back into the surface layer;

$P_{exc,Bi}$ and $P_{exc,As}$ are the probability that an atom of Bi or As, respectively, displaces an atom of Sb back into the surface layer;

$P_{exc,Bi}$ and $P_{exc,Sb}$ are the probability that an atom of Bi or Sb, respectively, displaces an atom of As back into the surface layer;

$P_{rem,Sb}$ and $P_{rem,As}$ are the probability of anion-assisted removal of an atom of Bi by an atom of element Sb or As, respectively;

$P_{rem,Bi}$ and $P_{rem,As}$ are the probability of anion-assisted removal of an atom of Sb by an atom of element Bi or As, respectively; and $P_{rem,Bi}$ and $P_{rem,Sb}$ are the probability of anion-assisted removal of an atom of element As by an atom of element Bi or Sb, respectively; and wherein similar equations exist for $\theta_{Sb}$ and mole fraction y by transposing components for y in place of x and vice-versa in the equations; and similar equations exist for $\theta_{As}$ and mole fraction z by transposing components for z in place of x and vice-versa in the equations. The identified conditions may be used to produce an InAsSbBi alloy composition having minimized bismuth-rich surface droplets.

In another aspect of the invention, there is provided a method to maximize Bi incorporation in droplet free InAsSbBi grown by molecular beam epitaxy (MBE), wherein the InAsSbBi composition is described by mole fractions of Bi, Sb and As, respectively x, y, and z, and surface coverages of Bi, Sb and As, respectively $\theta_{Bi}$, $\theta_{Sb}$, and $\theta_{As}$, the method comprising:

selecting a growth temperature, indium flux $F_{in}$, and target lattice mismatch $\varepsilon_{xx}$ to the substrate material, and supplying an initial estimate for the Bi mole fraction, x;

employing the model embodied by Equations 3, 4 and 4(a) to calculate the Bi, Sb and As flux ratios $F_{Bi}$, $F_{Sb}$, and $F_{As}$ for the target InAsSbBi composition:

$$\theta_{Bi} = \frac{F_{Bi}(F_{In} + F_{As}P_{exc,As} + F_{Sb}P_{exc,Sb})}{(F_{In} + F_{As}P_{exc,As} + F_{Sb}P_{exc,Sb})} \quad (3)$$
$$(R_{des,Bi} + R_{dro,Bi} + \Delta F_{As}P_{rem,As} + \Delta F_{Sb}P_{rem,Sb}) + F_{In}R_{inc,Bi}$$

$$x = \frac{\theta_{Bi}R_{inc,Bi}}{(F_{In} + F_{As}P_{exc,As} + F_{Sb}P_{exc,Sb})}, \quad (4)$$

$$= \frac{F_{Bi}R_{inc,Bi}}{(F_{In} + F_{As}P_{exc,As} + F_{Sb}P_{exc,Sb})}. \quad (4a)$$
$$(R_{des,Bi} + R_{dro,Bi} + \Delta F_{As}P_{rem,As} + \Delta F_{Sb}P_{rem,Sb}) + F_{In}R_{inc,Bi}$$

calculating the error between the model predicted excess As flux, $\Delta F_{As}$, and the minimum excess As flux, $\Delta F_{DF}$, required for droplet free growth at the specified growth temperature;

summing the excess As flux error, $\Delta F_{DF} - \Delta F_{As}$, with the As mole fraction z and recalculating the Bi, Sb and As mole fractions, x, y, and z, for the specified lattice mismatch $\varepsilon_{xx}$;

iterating the aforementioned steps until the excess As flux, $\Delta F_{As}$, matches the minimum excess As flux, $\Delta F_{DF}$, required for droplet free growth at the specified growth temperature, whereby the growth solution corresponding to maximum achievable Bi incorporation in droplet free InAsSbBi at the specified growth temperature and lattice mismatch is obtained;

where $R_{des,Bi}$, $R_{inc,Bi}$ and $R_{dro,Bi}$ are the rates of self-desorption, incorporation and droplet accumulation, respectively, for Bi;

$R_{des,Sb}$, $R_{inc,Sb}$ and $R_{dro,Sb}$ are the rates of self-desorption, incorporation and droplet accumulation, respectively, for Sb;

$R_{des,As}$, $R_{inc,As}$ and $R_{dro,As}$ are the rates of self-desorption, incorporation and droplet accumulation, respectively, for As;

$P_{exc,Sb}$ and $P_{exc,As}$ are the probability that an atom of Sb or As, respectively, displaces an atom of Bi back into the surface layer;

$P_{exc,Bi}$ and $P_{exc,As}$ are the probability that an atom of Bi or As, respectively, displaces an atom of Sb back into the surface layer;

$P_{exc,Bi}$ and $P_{exc,Sb}$ are the probability that an atom of Bi or Sb, respectively, displaces an atom of As back into the surface layer;

$P_{rem,Sb}$ and $P_{rem,As}$ are the probability of anion-assisted removal of an atom of Bi by an atom of element Sb or As, respectively;

$P_{rem,Bi}$ and $P_{rem,As}$ are the probability of anion-assisted removal of an atom of Sb by an atom of element Bi or As, respectively; and $P_{rem,Bi}$ and $P_{rem,Sb}$ are the probability of anion-assisted removal of an atom of As by an atom of element Bi or Sb, respectively; and wherein similar equations exist for $\theta_{Sb}$ and mole fraction y by transposing components for y in place of x and vice-versa in the equations; and similar equations exist for $\theta_{As}$ and mole fraction z by transposing components for z in place of x and vice-versa in the equations. The growth solution may be used to produce an InAsSbBi alloy composition having a maximum amount of bismuth.

BRIEF DESCRIPTION OF THE DRAWINGS

The following detailed description of various embodiments of the invention will be better understood when read in conjunction with the appended drawings. For the purpose of illustrating the invention, there are shown in the drawings illustrative embodiments. It should be understood, however, that the invention is not limited to the precise arrangements and instrumentalities of the embodiments shown in the drawings.

DETAILED DESCRIPTION

Figure 1:
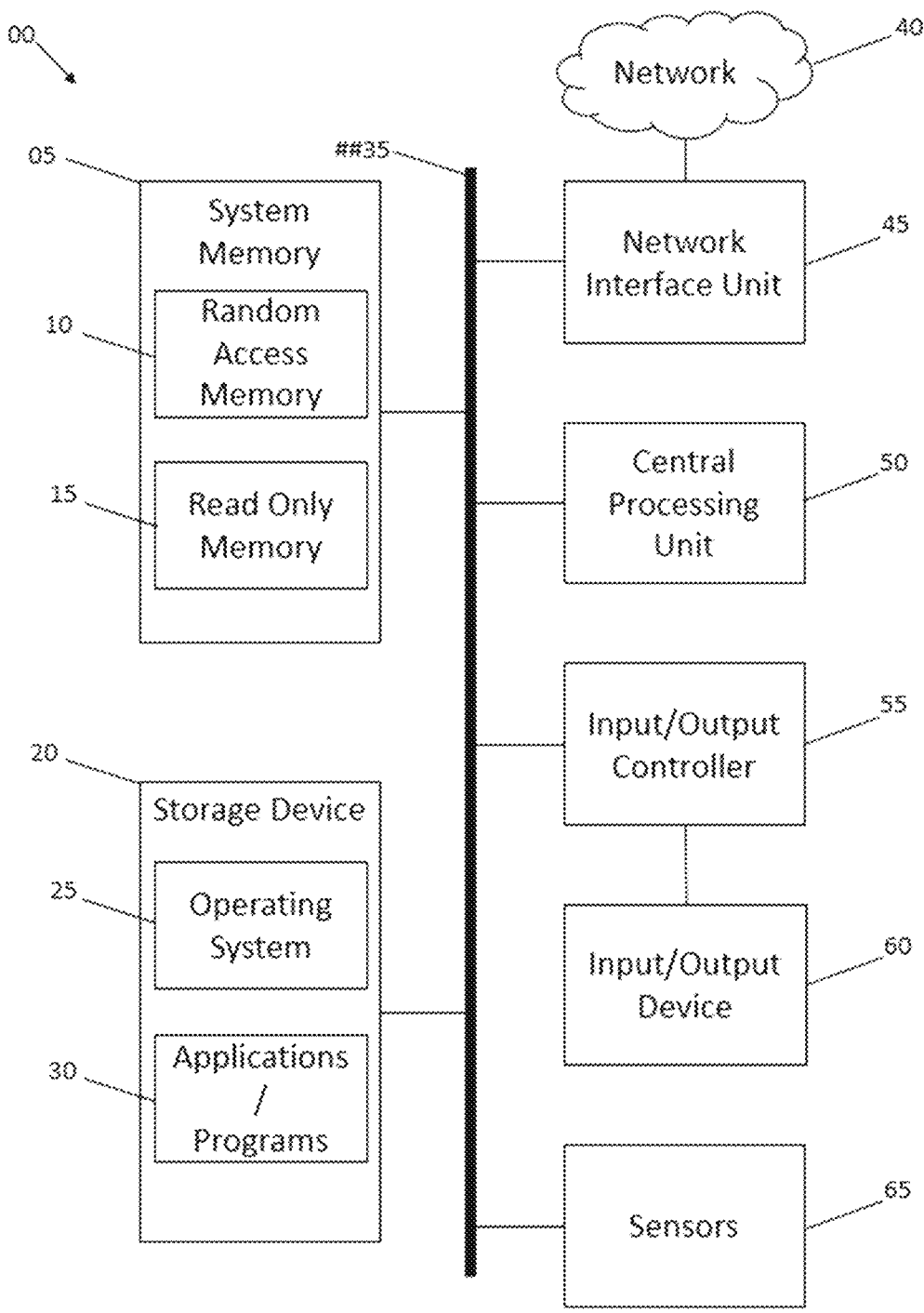
FIG. 1 depicts an illustrative computer architecture for a computer 00 for practicing the various embodiments of the invention.

The invention can be understood more readily by reference to the following detailed description, examples, drawings, and claims, and their previous and following description. However, it is to be understood that this invention is not limited to the specific compositions, articles, devices, systems, and/or methods disclosed unless otherwise specified, and as such, of course, can vary. While aspects of the invention can be described and claimed in a particular statutory class, such as the process/method statutory class, this is for convenience only and one of skill in the art will understand that each aspect of the invention can be described and claimed in any statutory class.

It is to be understood that the Figures and descriptions of the invention have been simplified to illustrate elements that are relevant for a clear understanding of the present invention, while eliminating, for the purpose of clarity, many other elements found in alloy materials and methods of making. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

While the invention is capable of being embodied in various forms, the description below of several embodiments is made with the understanding that the present disclosure is to be considered as an exemplification of the invention and is not intended to limit the invention to the specific embodiments illustrated. Headings are provided for convenience only and are not to be construed to limit the invention in any manner. Embodiments illustrated under any heading or in any portion of the disclosure may be combined with embodiments illustrated under the same or any other heading or other portion of the disclosure.

Any combination of the claim elements or method steps described herein in all possible variations thereof is encompassed by the invention unless otherwise indicated herein or otherwise clearly contradicted by context.

Unless otherwise expressly stated, it is in no way intended that any method or aspect set forth herein be construed as requiring that its steps be performed in a specific order. Accordingly, where a method claim does not specifically state in the claims or description that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of embodiments described in the specification. It is to be understood that both the foregoing general description and the following detailed description are exemplary and explanatory only and are not restrictive.

All publications mentioned herein are incorporated herein by reference to disclose and describe the methods and/or materials in connection with which the publications are cited.

As used herein, each of the following terms has the meaning associated with it in this section. Unless defined otherwise, all technical and scientific terms used herein generally have the same meaning as commonly understood by one of ordinary skill in the art to which this invention belongs.

The articles "a" and "an" are used herein to refer to one or to more than one (i.e., at least one) of the grammatical object of the article. By way of example, "an element" means one element or more than one element.

As used herein, the term "about" will be understood by persons of ordinary skill in the art and will vary to some extent depending on the context in which it is used. As used herein when referring to a measurable value such as an amount, a temporal duration, and the like, the term "about" is meant to encompass variations of ±20% or ±10%, more preferably ±5%, even more preferably ±1%, and still more preferably ±0.1% from the specified value, as such variations are appropriate to perform the disclosed methods.

As used herein, the term III-V alloy composition refers to a ternary, quaternary or higher alloy composition wherein ternary alloy composition refers to an alloy of a single Group III element and two different Group V elements, quaternary alloy composition refers to an alloy of a single Group III element and three different Group V elements, and a higher alloy composition refers to an alloy of a single Group III element and more than three different Group V elements. Furthermore, the term can be expanded to include alloys having more than one Group III element, but in such case, the combination of Group III elements is treated as a single Group III element.

As used herein, the term "V/In flux ratios" or "group-V/In flux ratios" refers to Group V element:Indium flux ratios.

Herein, "characteristic temperature" for incorporation $T_{inc}$ and desorption $T_{des}$ refers to the exponential temperature dependence embodied by the relation $f(T)=f_0e^{(T-T_0)}/T_c$, where $f_0$ is the function value at temperature $T_0$, and $T_c$ is the characteristic temperature.

As recited herein, in referring to the Growth Model, element mole fractions of elements X, Y and Z in an alloy composition, mole fractions x, y and z, are differentiated as $x_i$, $y_i$, and $z_i$, which are the measured mole fractions of X, Y and Z, respectively, for the i-th sample, and $\hat{x}_i$, $\hat{y}_i$, and $\hat{z}_i$, which are the modeled mole fractions of X, Y and Z, respectively. The differentiated notations are convenient in the development of the model, but both refer to mole fractions and outside of model development these can be used interchangeably. That is, herein, the $\hat{x}_i$, $\hat{y}_i$, and $\hat{z}_i$ notations may be regarded as a subset of the broader notation of mole fractions x, y and z and can normally be referred to as mole fractions x, y and z.

As used herein, the term "dilute bismide alloys" refers to alloys having a Bismuth content of 2% or less.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range. Further, for lists of ranges, including lists of lower preferable values and upper preferable values, unless otherwise stated, the range is intended to include the endpoints thereof, and any combination of values therein, including any minimum and any maximum values recited.

Aspects of the invention relate to algorithms executed in computer software. In some aspects of the present invention, software executing the instructions provided herein may be stored on a non-transitory computer-readable medium, wherein the software performs some or all of the steps of the invention when executed on a processor. Though certain embodiments may be described as written in particular programming languages, or executed on particular operating systems or computing platforms, it is understood that the system and method of the invention is not limited to any particular computing language, platform, or combination thereof. Software executing the algorithms described herein may be written in any programming language known in the art, compiled or interpreted, including but not limited to C, C++, C#, Objective-C, Java, JavaScript, MATLAB, Python, PHP, Perl, Ruby, or Visual Basic. It is further understood that elements of the present invention may be executed on any acceptable computing platform, including but not limited to a server, a cloud instance, a workstation, a thin client, a mobile device, an embedded microcontroller, a television, or any other suitable computing device known in the art.

Parts of this invention are described as software running on a computing device. Though software described herein may be disclosed as operating on one particular computing device (e.g. a dedicated server or a workstation), it is understood in the art that software is intrinsically portable and that most software running on a dedicated server may also be run, for the purposes of the present invention, on any of a wide range of devices including desktop or mobile devices, laptops, tablets, smartphones, watches, wearable electronics or other wireless digital/cellular phones, televisions, cloud instances, embedded microcontrollers, thin client devices, or any other suitable computing device known in the art.

Similarly, parts of this invention are described as communicating over a variety of wireless or wired computer networks. For the purposes of this invention, the words "network", "networked", and "networking" are understood to encompass wired Ethernet, fiber optic connections, wireless connections including any of the various 802.11 standards, cellular WAN infrastructures such as 3G, 4G/LTE, or 5G networks, Bluetooth®, Bluetooth® Low Energy (BLE) or Zigbee® communication links, or any other method by which one electronic device is capable of communicating with another. In some embodiments, elements of the networked portion of the invention may be implemented over a Virtual Private Network (VPN).

FIG. 1 and the following discussion are intended to provide a brief, general description of a suitable computing environment in which the invention may be implemented. While the invention is described above in the general context of program modules that execute in conjunction with an application program that runs on an operating system on a computer, those skilled in the art will recognize that the invention may also be implemented in combination with other program modules.

Generally, program modules include routines, programs, components, data structures, and other types of structures that perform particular tasks or implement particular abstract data types. Moreover, those skilled in the art will appreciate that the invention may be practiced with other computer system configurations, including hand-held devices, multiprocessor systems, microprocessor-based or programmable consumer electronics, minicomputers, mainframe computers, and the like. The invention may also be practiced in distributed computing environments where tasks are performed by remote processing devices that are linked through a communications network. In a distributed computing environment, program modules may be located in both local and remote memory storage devices.

FIG. 1 depicts an illustrative computer architecture for a computer 00 for practicing the various embodiments of the invention. The computer architecture shown in FIG. 1 illustrates a conventional personal computer, including a central processing unit 50 ("CPU"), a system memory 05, including a random access memory 10 ("RAM") and a read-only memory ("ROM") 15, and a system bus 35 that couples the system memory 05 to the CPU 50. A basic input/output system containing the basic routines that help to transfer information between elements within the computer, such as during startup, is stored in the ROM 15. The computer 00 further includes a storage device 20 for storing an operating system 25, application/program 30, and data.

The storage device 20 is connected to the CPU 50 through a storage controller (not shown) connected to the bus 35. The storage device 20 and its associated computer-readable media provide non-volatile storage for the computer 00. Although the description of computer-readable media contained herein refers to a storage device, such as a hard disk or CD-ROM drive, it should be appreciated by those skilled in the art that computer-readable media can be any available media that can be accessed by the computer 00.

By way of example, and not to be limiting, computer-readable media may comprise computer storage media. Computer storage media includes volatile and non-volatile, removable and non-removable media implemented in any method or technology for storage of information such as computer-readable instructions, data structures, program modules or other data. Computer storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other medium which can be used to store the desired information and which can be accessed by the computer.

According to various embodiments of the invention, the computer 00 may operate in a networked environment using logical connections to remote computers through a network 40, such as TCP/IP network such as the Internet or an intranet. The computer 00 may connect to the network 40 through a network interface unit 45 connected to the bus 35. It should be appreciated that the network interface unit 45 may also be utilized to connect to other types of networks and remote computer systems.

The computer 00 may also include an input/output controller 55 for receiving and processing input from a number of input/output devices 60, including a keyboard, a mouse, a touchscreen, a camera, a microphone, a controller, a joystick, or other type of input device. Similarly, the input/output controller 55 may provide output to a display screen, a printer, a speaker, or other type of output device. The computer 00 can connect to the input/output device 60 via a wired connection including, but not limited to, fiber optic, ethernet, or copper wire or wireless means including, but not limited to, Bluetooth, Near-Field Communication (NFC), infrared, or other suitable wired or wireless connections.

As mentioned briefly above, a number of program modules and data files may be stored in the storage device 20 and RAM 10 of the computer 00, including an operating system 25 suitable for controlling the operation of a networked computer. The storage device 20 and RAM 10 may also store one or more applications/programs 30. In particular, the storage device 20 and RAM 10 may store an application/program 30 for providing a variety of functionalities to a user. For instance, the application/program 30 may comprise many types of programs such as a word processing application, a spreadsheet application, a desktop publishing application, a database application, a gaming application, internet browsing application, electronic mail application, messaging application, and the like. According to an embodiment of the present invention, the application/program 30 comprises a multiple functionality software application for providing word processing functionality, slide presentation functionality, spreadsheet functionality, database functionality and the like.

The computer 00 in some embodiments can include a variety of sensors 65 for monitoring the environment surrounding and the environment internal to the computer 00. These sensors 65 can include a Global Positioning System (GPS) sensor, a photosensitive sensor, a gyroscope, a magnetometer, thermometer, a proximity sensor, an accelerometer, a microphone, biometric sensor, barometer, humidity sensor, radiation sensor, or any other suitable sensor.

Growth Model

Figure 2:
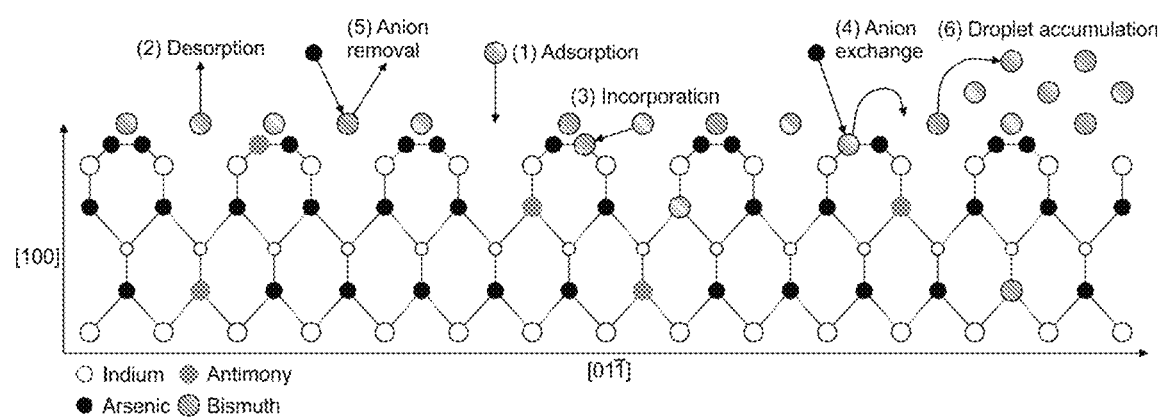
FIG. 2 is a schematic of (100) growth surface illustrating the six processes occurring during molecular beam epitaxy growth. (1) Adsorption of incident Bi flux into the surface layer. (2) Desorption of Bi from the surface layer. (3) Incorporation of Bi on a group V lattice site. (4) Anion exchange wherein an incident As or Sb atom displaces a Bi atom from a group V lattice site back into the adsorbed surface layer. (5) Anion-assisted removal wherein the desorption of As or Sb from the surface participates in the removal of Bi from the surface layer. (6) Accumulation of adsorbed Bi into Bi-rich surface droplets.

The kinetic growth model presented here borrows elements from the work of Lu et al. (Appl. Phys. Lett. 92(19), 192110 (2008)), Lewis et al. (Appl. Phys. Lett. 101(8), 082112 (2012)), and Tait et al. (J. Appl. Phys. 119, 215302 (2016)) discussed in the introduction. These include the concepts of a weakly-bound surface layer of Bi distinct from the crystal termination layer, the possibility of anion exchange with Bi incorporated in the termination layer, and the accumulation of surface Bi into droplets. Specifically this model of molecular beam epitaxy growth consists of six mechanisms, illustrated schematically in FIG. 2. (1) Incident Bi flux physically adsorbs to the growth surface in a weakly-bound surface layer. (2) The physisorbed Bi desorbs from the surface, depleting the surface layer, or (3) chemisorbs to a group-V lattice site in the crystal termination layer by forming an In—Bi bond. (4) Incident As or Sb flux displaces Bi from the crystal termination layer back into the physisorbed surface layer, breaking the In—Bi bond and replacing it with an In—As or In—Sb bond. (5) The desorption of excess As or Sb flux from the surface results in anion-assisted removal of Bi from the surface layer. Only the portion of the As or Sb flux that does not incorporate into the growing crystal is available to participate in anion-assisted removal of Bi. This stands in contrast to the model presented by Tait et al. that assumes that this process is proportional to the total incident As flux. Finally, (6) the coalescence of excess physisorbed Bi into Bi-rich droplet features commonly observed in bismide alloys.

The physisorbed Bi layer covers fraction $\theta_{Bi}$ of the growth surface and is initially absent at the time the Bi flux is first introduced. It is assumed that i) all incident Bi flux physisorbs to this surface layer, ii) the mole fractions in the crystal termination layer are the same as that of the bulk crystal in steady state, and iii) all processes affecting the Bi surface layer occur at its surface or interface with the crystal termination layer. A reflection of any part of the incident Bi flux without physisorption into the surface Bi layer is not distinguishable from the Bi desorption process, and is hence accounted for in that term.

In principle, the rate equations for the Bi surface coverage fraction $\theta_{Bi}$ and Bi mole fraction can be developed for the time-dependent growth of InAsSbBi given appropriate knowledge of rates, probabilities, initial conditions, and the density of available sites in the surface layer and crystal termination layer. However, these properties are generally not well characterized, and the time-dependent solution of these equations is intractable except in the simplest cases. In this work, the assumption of steady state growth is invoked, where the Bi surface coverage and mole fraction are constant with respect to time. Key to this assumption is that the relaxation time to achieve steady state growth is significantly less than the duration of the InAsSbBi epilayer growth. The Bi surface layer coverage is thus governed by the balance between mechanisms that increase the surface coverage and those that reduce it, with $$F_{Bi} + \hat{x}(F_{As}P_{exc,As} + F_{Sb}P_{exc,Sb}) = \theta_{Bi}(R_{des} + R_{inc} + R_{dro} + \Delta F_{As}P_{rem,As} + \Delta F_{Sb}P_{rem,Sb}). \quad (1)$$

The terms on the left-hand side serve to increase the Bi surface coverage. The first term, $F_{Bi}$, is the incident Bi flux, labeled as (1) in FIG. 2. The second bracketed term is the anion-assisted exchange, labeled as (4) in FIG. 2. This process is proportional to the Bi mole fraction $\hat{x}$, the incident As and Sb fluxes $F_{As}$ and $F_{Sb}$, and the probabilities $P_{exc,As}$ and $P_{exc,Sb}$ that an As or Sb atom displaces a Bi atom back into the surface layer.

The terms on the right-hand side scale with and serve to decrease the Bi surface coverage fraction $\theta_{Bi}$. The first, second, and third terms are the rates of Bi self-desorption $R_{des}$, Bi incorporation $R_{inc}$, and droplet accumulation $R_{dro}$, labeled as (2), (3), and (6) respectively in FIG. 2. The fourth and fifth terms are the anion-assisted removal of Bi by the excess As and Sb fluxes $\Delta F_{As}$, and $\Delta F_{Sb}$ and the associated probabilities $P_{rem,As}$ and $P_{rem,Sb}$, labeled as (5) in FIG. 2. Excess flux is defined as the fraction of incident flux that does not incorporate.

By similar logic the modeled Bi mole fraction $\hat{x}$ in the crystal termination layer is given by the sum of the rates of the incorporation and removal processes, with $$\hat{x}F_{In} = \theta_{Bi}R_{inc} - \hat{x}(F_{As}P_{exc,As} + F_{Sb}P_{exc,Sb}), \quad (2)$$

where $F_{In}$ is the In flux that is observed to (and hence assumed to) fully incorporate into the surface termination layer. The anion-assisted exchange removes Bi from the crystal termination layer into the surface layer; a process that is proportional to the density of Bi occupied group-V sublattice sites and hence the Bi mole fraction. Solving the system of Eqs. 1 and 2 yields a steady state solution for the Bi surface coverage fraction and the Bi mole fraction, with $$\theta_{Bi} = \frac{F_{Bi}(F_{In} + F_{As}P_{exc,As} + F_{Sb}P_{exc,Sb})}{(F_{In} + F_{As}P_{exc,As} + F_{Sb}P_{exc,Sb})(R_{des} + R_{dro} + \Delta F_{As}P_{rem,As} + \Delta F_{Sb}P_{rem,Sb}) + F_{In}R_{inc}}, \quad (3)$$

$$\hat{x} = \frac{\theta_{Bi}R_{inc}}{(F_{In} + F_{As}P_{exc,As} + F_{Sb}P_{exc,Sb})}, \quad (4)$$

$$= \frac{F_{Bi}R_{inc}}{(F_{In} + F_{As}P_{exc,As} + F_{Sb}P_{exc,Sb})(R_{des} + R_{dro} + \Delta F_{As}P_{rem,As} + \Delta F_{Sb}P_{rem,Sb}) + F_{In}R_{inc}}. \quad (4a)$$

Eqs. 3 and 4 constitute the model for bismuth incorporation in the molecular beam epitaxy growth of InAsSbBi.

During the growth of III-V materials using mixed group-V fluxes with a cumulative flux greater than the cumulative group-III flux, the group-V elements terminate the growth surface and compete with each other to incorporate into the growing crystal. Moreover, at typical growth temperatures the group-III elements readily incorporate, establishing the growth rate of the III-V crystal. Therefore, there is a similar set of surface coverage and incorporation relations for Sb and As, with respective mole fractions $\hat{y}$ and $\hat{z}=1-\hat{x}-\hat{y}$ and surface layer fractions $\theta_{Sb}$ and $\theta_{As}$. Like Bi, the presence of adsorbed Sb and As drives the incorporation of these elements into the crystal termination layer. The total fraction of surface covered is given by the sum of the fraction covered by each group-V element, which is at most unity, with $$\theta_{Bi} + \theta_{Sb} + \theta_{As} \leq 1. \quad (5)$$

In the model, the surface coverage fractions are constants of proportionality that mediate the rates of incorporation and removal of the various group-V elements from the surface layer. Driven by the relative fractions of the incoming group-V fluxes, each element competes for a fraction of the surface states that subsequently drives their incorporation into the group-V sublattice sites. The inequality in Eq. 5 comes from the fact that there may be surface states that are occupied by vacancies or group-III elements, particularly at or near stoichiometric group-V fluxes. The interpretation of the surface coverage fractions, which do not specify the amount of a given element on the surface but instead the compositional makeup of the surface layer, is similar to that of the bulk mole fractions, which do not specify the thickness of the InAsSbBi layer but instead the compositional makeup of the bulk layer.

The model is linear in that the rate parameters are constant for a given temperature and do not depend on the size of the flux. This is a reasonable assumption when the excess group-V fluxes are relatively small compared to the total incoming flux, as in this work. However, the constant rates do not necessarily extrapolate to the use of much larger excess group-V fluxes. In this case, desorption of the group-V material from the surface can exceed the growth rate, while the surface fractions and rates of incorporation remain roughly constant. The amount of group-V material on the surface likely increases, however, as much of the increase is not as strongly bound to the surface layer, the desorption rate itself increases.

The three models for fractional surface coverage for Bi, Sb, and As are symmetric with the exception of the absence of the uptake of Sb and As into surface droplets that are not observed when Bi is not present. The Sb model equations include the probabilities of As- and Bi-assisted exchange and removal, while the As model equations include the probabilities of Sb- and Bi-assisted exchange and removal. In general, the probabilities relating the interactions between Bi, Sb, and As are not bidirectional. For example, the probability of a given As atom exchanging with a Bi atom in the crystal termination layer is not equal to the probability of a given Bi atom exchanging with an As atom.

The model parameters determined by experimental measurements are the In, As, Sb, and Bi fluxes $F_{In}$, $F_{As}$, $F_{Sb}$, and $F_{Bi}$, the excess As, Sb, and Bi fluxes $\Delta F_{As}$, $\Delta F_{Sb}$, and $\Delta F_{Bi}$, and the droplet uptake rate parameter for Bi, $R_{dro}$. The other model parameters are determined by fitting Eq. 4 to the experimental measurements of the As, Sb, and Bi mole fractions. The best fit parameters are the exchange probabilities $P_{exc}$, the removal probabilities $P_{rem}$, and the desorption and incorporation rate parameters $R_{des}$ and $R_{inc}$ that typically depend on growth temperature. In addition, Eq. 3 of the model yields the best fit values for the surface coverage fractions $\theta_{Bi}$, $\theta_{Sb}$, and $\theta_{As}$, and Eq. 4 yields the best fit values for the mole fractions $\hat{x}$, $\hat{y}$, and $\hat{z}$ or the incorporation coefficients $\hat{x}F_{In}/F_{Bi}$, $\hat{y}F_{In}/F_{Sb}$, and $\hat{x}F_{In}/F_{As}$.

In the absence of in-situ measurements of the droplet evolution, the average rate of droplet accumulation is determined using ex-situ measurements of the InAsSbBi layer thickness and droplet size and density. These measurements probe the average rate of Bi uptake by the droplets that is expressed as $\theta_{Bi}R_{dro}$ in Eq. 1, with the average uptake rate parameter $R_{dro}$ determined using a self-consistent fitting procedure described in Section IV below.

It is instructive to consider the limiting cases of the growth model. If the anion-assisted removal and anion exchange process are small, the Bi surface layer coverage $\theta_{Bi}$ approaches $F_{Bi}/(R_{des}+R_{dro}+R_{inc})$ and the Bi mole fraction $\hat{x}$ is reduced to $F_{Bi}/F_{In}-\theta_{Bi}(R_{des}+R_{dro})/F_{In}$. In this limit, the Bi/In flux ratio drives incorporation and the surface coverage drives desorption and droplet accumulation. If the growth temperatures are insufficient to desorb surface Bi, the excess Bi flux that does not incorporate surface segregates and accumulates in surface droplets. On the other hand, if the rates of desorption and droplet uptake are small compared to the rate of incorporation, the surface coverage approaches $F_{Bi}/R_{inc}$ and the Bi mole fraction $\hat{x}$ approaches $F_{Bi}/F_{In}$. Physically this occurs during low temperature growth with small As overpressures where the Bi mole fraction approaches the incident Bi/In flux ratio.

When the Bi incorporation rate $R_{inc}$ is small compared to any of the processes that remove surface Bi, Eqs. 3 and 4 can be approximated to first order in $R_{inc}$ as $$\theta_{Bi} \approx \frac{F_{Bi}}{(R_{des} + R_{dro} + \Delta F_{As}P_{rem,As} + \Delta F_{Sb}P_{rem,Sb})}, \text{ and} \quad (6a)$$

$$\hat{x} \approx \frac{F_{Bi}R_{inc}}{\frac{(F_{In} + F_{As}P_{exc,As} + F_{Sb}P_{exc,Sb})}{(R_{des} + R_{dro} + \Delta F_{As}P_{rem,As} + \Delta F_{Sb}P_{rem,Sb})}} \quad (6b)$$

Physically this corresponds to the case where the Bi does not significantly accumulate on the surface or incorporate in crystal, which typically occurs during high temperature growth or with the use of excessively large As and Sb fluxes. Furthermore, to first order, the incorporation rate $$R_{inc} \approx \frac{\hat{x}F_{In}}{F_{Bi}}\left(1 + \frac{F_{As}}{F_{In}}P_{exc,As} + \frac{F_{sb}}{F_{In}}P_{exc,Sb}\right) \quad (6c)$$

$$(R_{des} + R_{dro} + \Delta F_{As}P_{rem,As} + \Delta F_{Sb}P_{rem,Sb}),$$

where $\hat{x}F_{In}/F_{Bi}$ is the Bi incorporation coefficient.

Uses

The model can be applied to growth of optoelectronic devices including lasers, photodiodes, photodetectors, and light-emitting diodes for commercial and industrial applications including missile guidance technology, highly secure short-range free-space telecommunications, detectors for autonomous vehicle applications, mid-IR detectors for greenhouse gases, threat-detection systems, and lighter and more sensitive thermographic cameras.

EXPERIMENTAL

The invention is now described with reference to the following methods and Examples. These methods and Examples are provided for the purpose of illustration only, and the invention is not limited to these methods and Examples, but rather encompasses all variations that are evident as a result of the teachings provided herein.

Experimental Methodology

Figure 3:
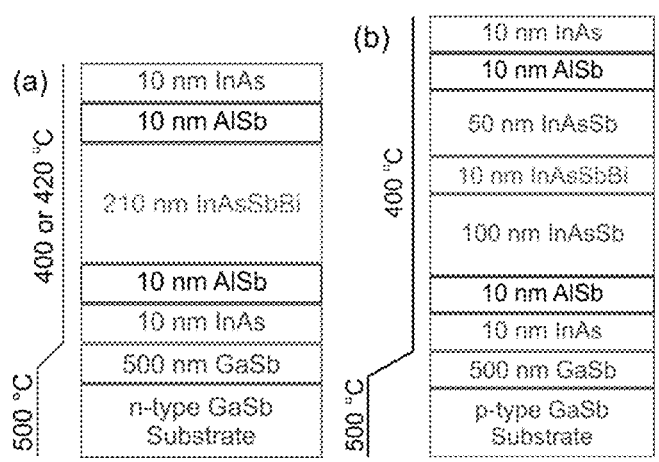
FIG. 3 illustrates sample cross sections for (a) 210 nm bulk InAsSbBi (samples A through D and H through Q) and (b) 10 nm InAsSbBi quantum wells (samples E through G). The 10 nm thick compressive AlSb and tensile InAs barriers provide carrier confinement. Growth temperature profiles are shown on the left.

Nearly-lattice-matched bulk InAsSbBi and InAsSb/InAsSbBi/InAsSb quantum well structures were grown by molecular beam epitaxy on ¼ 50 mm (100) oriented GaSb substrates at temperatures of 400° C. and 420° C. The sample structures are illustrated in FIG. 3 with 210 nanometer (nm) thick bulk InAsSbBi layers shown in (a) and 10 nm thick InAsSbBi quantum wells shown in (b). The growths consist of a 500 nm GaSb buffer, a 10 nm InAs/10 nm AlSb partially strain-balanced barrier, an active region containing InAsSbBi bulk or quantum well layers, and a 10 nm AlSb/10 nm InAs barrier and cap layer. The GaSb buffer layer was grown at 500° C. except for the last 70 nm, where the substrate temperature was reduced by 80 to 100° C. in the preparation for the growth of InAsSbBi. The substrate temperature was measured using an Ircon Modline 3 (model 3G-10C05) pyrometer.

The growth rate was directly proportional to the incident In flux, (Horikoshi et al., Jap. J. Appl. Phys. 27, 169-179 (1988); Cho et al., Thin Film Solids 100, 291-317 (1983)) as In does not accumulate on or desorb from the surface under group-V rich fluxes at these growth temperatures due to its low vapor pressure. (Alcock et al., Canadian Metallurgical Quarterly 23, 309 (1984)). The samples were grown with a constant In flux of $4.4 \times 10^{14}$ cm$^{-2}$ s$^{-1}$ corresponding to an InAsSbBi on GaSb growth rate of about 15 nm/min or 0.82 monolayers per second. The In growth rate was calibrated by X-ray diffraction measurements of InAs/AlSb superlattices grown on GaSb and was maintained on an ongoing basis from measurements of bulk InAsSb and InAsSbBi growths. The As/In and Sb/In flux ratios were calibrated prior to each growth by growing InAs on InAs and InSb on InSb and slowly lowering the V/In flux ratio until the transition from a group V to a group III rich surface reconstruction was observed. This procedure accurately and repeatably calibrated the one-to-one V/In flux ratios for As and Sb. The Bi flux was initially calibrated using scanning electron microscope measurements of the thickness of 190 nm of elemental Bi deposited on GaAs at 100° C. The Bi flux calibration was maintained on an ongoing basis by Rutherford backscattering and X-ray diffraction measurements of InAsBi layers grown on GaSb substrates at 270 to 280° C. using near-unity As/In flux ratios that result in near-unity Bi incorporation (Shalindar et al., J. Appl. Phys. 120, 145704 (2016)).

The InAsSbBi alloy requires two measurements sensitive to the group-V mole fractions to determine its chemical composition. The Bi and Sb mole fractions were determined from the unstrained bulk lattice constant ascertained from X-ray diffraction measurements and the unstrained zero-temperature bandgap ascertained from steady state photoluminescence spectroscopy measurements. The InAsSbBi tetragonal distortion, in-plane strain, and unstrained lattice constant was determined from symmetric $\omega$–$2\theta$ X-ray diffraction measurements of the (400) crystal plane and subsequent dynamical simulations of the diffraction pattern. For all samples, the in-plane strain was observed to be less than 0.18%, with corresponding Matthews-Blakeslee critical thickness (Matthews and Blakeslee, J. Crystal Growth 27, 18-125 (1974)), greater than 210 nm, thus justifying the use of symmetric X-ray diffraction measurements to determine the InAsSbBi lattice constant.

The steady state photoluminescence spectroscopy measurements yielded the bandgap energy as a function of temperature in the range from 12 K to 300 K. The samples were mounted in a closed-loop He-refrigerated cryostat and optically pumped using a modulated 785 nm laser diode at an average pump power of 100 mW, providing an active layer excitation density of 36 W/cm$^2$. The photoluminescence was collected using a Nicolet Magna-IR 760 Fourier Transform infrared spectrometer with an InSb detector with a cutoff wavelength of 5.5 µm. The pump laser was modulated at 50 kHz and the detector signal was fed through a phase-locked loop amplifier for improved signal-to-noise ratio. The system optical throughput was measured and corrected using the spectrum from a Mikron M305 black body source at 800° C. The bandgap energy was determined from the first derivative maximum of the photoluminescence spectrum, which corresponds to the energy at which the joint optical density of states increases at its greatest rate. (Webster et al., J. Appl. Phys. 118, 245706 (2015); Webster et al., Appl. Phys. Lett. 106, 061907 (2015); Souri et al., Appl. Phys. B 119, 273-279 (2015); Webster et al., J. Appl. Phys. 119, 225701 (2016)). An Einstein single oscillator model was fit to the temperature-dependent bandgap energy data to determine the low-temperature bandgap energy of each InAsSbBi sample.(Johnson and Tiedje, J. Appl. Phys. 78, 5609 (1995); Viña et al., Phys. Rev. B 30, 1979 (1984)).

The measured InAsSbBi lattice constant and low-temperature bandgap energy are related to the Bi, Sb, and As mole fractions through Vegard's Law (Vegard, Z. Phys. 5, 17-26 (1921)) and the InAsSbBi bandgap bowing model. This system of two equations was numerically solved to determine the Bi and Sb mole fractions x and y respectively, from which the As mole fraction is given as 1−x−y. The uncertainty σ in the Bi and Sb mole fractions is given by the uncertainty in the determination of the InAsSbBi lattice constant from X-ray diffraction measurements and the uncertainty in the determination of the low temperature bandgap energy from temperature dependent photoluminescence measurements, with $$\sigma = \sqrt{\sigma_a^2 + \sigma_g^2}, \quad (7)$$

where $\sigma_a$, is the uncertainty in the mole fraction inferred from the precision of the InAsSbBi lattice constant measurement and $\sigma_g$ is the uncertainty in the mole fraction inferred from the frozen-in width of the InAsSbBi low-temperature photoluminescence spectrum, that is significantly broadened by the addition of even dilute amounts of Bi. The broadening is a result of lateral variations in the Bi mole fraction(Kosireddy et al., J. Appl. Phys. 126, 095108 (2019)) and the increase in the density of localized band edge states due to the size and electronic mismatch of Bi atoms, pairs, and clusters. (Christian et al., Japanese J. Appl. Phys. 56, 035801 (2017); Kini et al., Phys. Rev. B 83, 075307 (2011)). As such, $\sigma_g$ is also a measure of the range of the Bi mole fractions present in the InAsSbBi layer. In Eq. 7 it is assumed that the two uncertainties are uncorrelated such that the covariance of $\sigma_a$ and $\sigma_g$ is zero. Details of the determination of the Bi, Sb, and As mole fraction uncertainties are provided below in the section titled "Calculation of Mole Fraction Uncertainty".

The seven InAsSbBi samples grown at 400° C. and the ten samples grown at 420° C. were examined and are summarized in Tables I and II. The sample name, growth cross-section, growth temperature, incident group-V/In flux ratios, excess flux ratios, surface morphology (specular or droplet-covered), group-V mole fractions, incorporation coefficients, and mole fraction measurement uncertainty are shown below. The excess group-V/In flux ratios are given by the incident flux ratio less the mole fraction. Although not directly controlled, the excess As/In flux ratio was targeted for each growth as it is observed to be a strong mediator of the incorporation of Bi and the formation of Bi-rich surface droplets.

For the Sb/In and Bi/In flux ratios used here, As/In flux ratios near 0.9 resulted in near unity incorporation of the incident As flux, while larger values resulted in the presence of excess As at the growth surface. The total group-V flux was greater than unity, and in particular there was excess Sb flux present, therefore, at the very least, a small positive excess As flux was expected. Nevertheless, the reported excess As/In flux ratio was slightly negative for two growths, with −0.2% for sample E and −0.1% for sample M. However, these values are within that expected when the uncertainties in the mole fraction measurements and As/In flux calibrations are considered.

TABLE I

InAsSbBi sample cross section, growth temperature, V/In flux ratios, excess V/In flux ratios, and observed surface morphology. The "Bulk" cross section is the 210 nm thick InAsSbBi layer shown in FIG 3a. The "QW" cross section is the 10 nm thick InAsSbBi quantum well shown in FIG 3b.

| Sample | Cross section | Growth temperature (° C.) | Flux ratios Bi/In | Sb/In | As/In | Excess flux ratios Bi/In | Sb/In | As/In | Surface morphology |
|---|---|---|---|---|---|---|---|---|---|
| A | Bulk | 400 | 0.05 | 0.120 | 0.940 | 0.044 | 0.029 | 0.036 | Specular |
| B | Bulk | 400 | 0.05 | 0.120 | 0.911 | 0.043 | 0.024 | 0.014 | Droplets |
| C | Bulk | 400 | 0.05 | 0.120 | 0.911 | 0.042 | 0.020 | 0.020 | Droplets |
| D | Bulk | 400 | 0.05 | 0.105 | 0.911 | 0.044 | 0.016 | 0.006 | Droplets |
| E | QW | 400 | 0.10 | 0.100 | 0.911 | 0.081 | 0.032 | −0.002 | Specular |
| F | QW | 400 | 0.10 | 0.100 | 0.911 | 0.083 | 0.018 | 0.009 | Specular |
| G | QW | 400 | 0.10 | 0.100 | 0.911 | 0.087 | 0.011 | 0.014 | Specular |
| H | Bulk | 420 | 0.05 | 0.120 | 0.940 | 0.047 | 0.023 | 0.040 | Specular |
| I | Bulk | 420 | 0.05 | 0.120 | 0.940 | 0.048 | 0.026 | 0.036 | Specular |
| J | Bulk | 420 | 0.05 | 0.120 | 0.930 | 0.048 | 0.025 | 0.027 | Specular |
| K | Bulk | 420 | 0.05 | 0.120 | 0.920 | 0.048 | 0.025 | 0.017 | Specular |
| L | Bulk | 420 | 0.05 | 0.120 | 0.910 | 0.048 | 0.023 | 0.010 | Specular |
| M | Bulk | 420 | 0.05 | 0.120 | 0.900 | 0.048 | 0.023 | −0.001 | Droplets |
| N | Bulk | 420 | 0.05 | 0.080 | 0.977 | 0.049 | 0.015 | 0.043 | Specular |
| O | Bulk | 420 | 0.05 | 0.080 | 0.947 | 0.048 | 0.018 | 0.011 | Droplets |
| P | Bulk | 420 | 0.10 | 0.080 | 0.977 | 0.097 | 0.017 | 0.043 | Specular |
| Q | Bulk | 420 | 0.20 | 0.080 | 0.947 | 0.197 | 0.018 | 0.012 | Droplets |

TABLE II

InAsSbBi sample cross section, growth temperature, group-V mole fractions, group-V incorporation coefficients, and mole fraction uncertainty. The "Bulk" cross section is the 210 nm thick InAsSbBi layer shown in FIG 3a. The "QW" cross section is the 10 nm thick InAsSbBi quantum well shown in FIG 3b.

| Sample | Cross section | Growth temperature (° C.) | Measured mole fractions (%) Bi | Sb | As | Incorporation coefficients (%) Bi | Sb | As | Mole fraction uncertainty (%) Bi | Sb | As |
|---|---|---|---|---|---|---|---|---|---|---|---|
| A | Bulk | 400 | 0.58 | 9.06 | 90.36 | 11.7 | 76.3 | 96.1 | 0.21 | 0.28 | 0.49 |
| B | Bulk | 400 | 0.71 | 9.61 | 89.68 | 13.7 | 77.4 | 98.4 | 0.22 | 0.28 | 0.50 |
| C | Bulk | 400 | 0.81 | 10.05 | 89.14 | 15.1 | 78.1 | 97.8 | 0.22 | 0.28 | 0.51 |

TABLE II-continued

InAsSbBi sample cross section, growth temperature, group-V mole fractions, group-V incorporation coefficients, and mole fraction uncertainty. The "Bulk" cross section is the 210 nm thick InAsSbBi layer shown in FIG 3a. The "QW" cross section is the 10 nm thick InAsSbBi quantum well shown in FIG 3b.

| Sample | Cross section | Growth temperature (° C.) | Measured mole fractions (%) | | | Incorporation coefficients (%) | | | Mole fraction uncertainty (%) | | |
|---|---|---|---|---|---|---|---|---|---|---|---|
| | | | Bi | Sb | As | Bi | Sb | As | Bi | Sb | As |
| D | Bulk | 400 | 0.58 | 8.92 | 90.50 | 11.0 | 80.2 | 99.3 | 0.21 | 0.28 | 0.49 |
| E | QW | 400 | 1.86 | 6.85 | 91.29 | 18.6 | 68.7 | 100.2 | 0.31 | 0.47 | 0.77 |
| F | QW | 400 | 1.67 | 8.17 | 90.16 | 16.7 | 81.7 | 99.0 | 0.31 | 0.47 | 0.76 |
| G | QW | 400 | 1.35 | 8.90 | 89.75 | 13.5 | 89.0 | 98.5 | 0.31 | 0.47 | 0.76 |
| H | Bulk | 420 | 0.29 | 9.70 | 90.01 | 5.9 | 82.8 | 95.8 | 0.18 | 0.28 | 0.46 |
| I | Bulk | 420 | 0.22 | 9.42 | 90.36 | 4.4 | 78.6 | 96.1 | 0.17 | 0.28 | 0.46 |
| J | Bulk | 420 | 0.21 | 9.48 | 90.31 | 4.2 | 79.1 | 97.1 | 0.17 | 0.28 | 0.45 |
| K | Bulk | 420 | 0.20 | 9.46 | 90.34 | 4.0 | 79.0 | 98.2 | 0.17 | 0.28 | 0.45 |
| L | Bulk | 420 | 0.23 | 9.74 | 90.03 | 4.6 | 81.2 | 98.9 | 0.18 | 0.28 | 0.46 |
| M | Bulk | 420 | 0.21 | 9.67 | 90.12 | 4.2 | 80.7 | 100.1 | 0.17 | 0.28 | 0.45 |
| N | Bulk | 420 | 0.12 | 6.48 | 93.40 | 2.4 | 81.7 | 95.6 | 0.16 | 0.28 | 0.44 |
| O | Bulk | 420 | 0.20 | 6.18 | 93.62 | 4.0 | 77.9 | 98.9 | 0.17 | 0.28 | 0.45 |
| P | Bulk | 420 | 0.29 | 6.28 | 93.43 | 2.9 | 79.1 | 95.6 | 0.18 | 0.28 | 0.46 |
| Q | Bulk | 420 | 0.33 | 6.18 | 93.49 | 1.7 | 77.9 | 98.7 | 0.19 | 0.28 | 0.47 |

It was observed that the Bi-rich droplets, when present, do not significantly desorb or diffuse across the growth surface during the growth of the InAsSbBi layers or the subsequent capping layers or during the ramp-down of the sample to room temperature. Therefore, the surface droplet coverage and associated droplet accumulation rate was treated as an independent variable in the analysis whose value is determined by surface morphology measurements described below.

The samples were examined by Nomarski optical microscopy using an Olympus MX50 optical microscope with Nomarski prism, analyzer, and polarizer components. The Nomarski images indicate that 400° C. grown samples B, C, D, and 420° C. grown samples M, O, and Q exhibit significant droplet coverage, while the remaining samples were specular with no observable droplet features. The results are listed as specular or droplets in Table I, which are in agreement with the visual observations of either specular or hazy surfaces.

Figure 4:
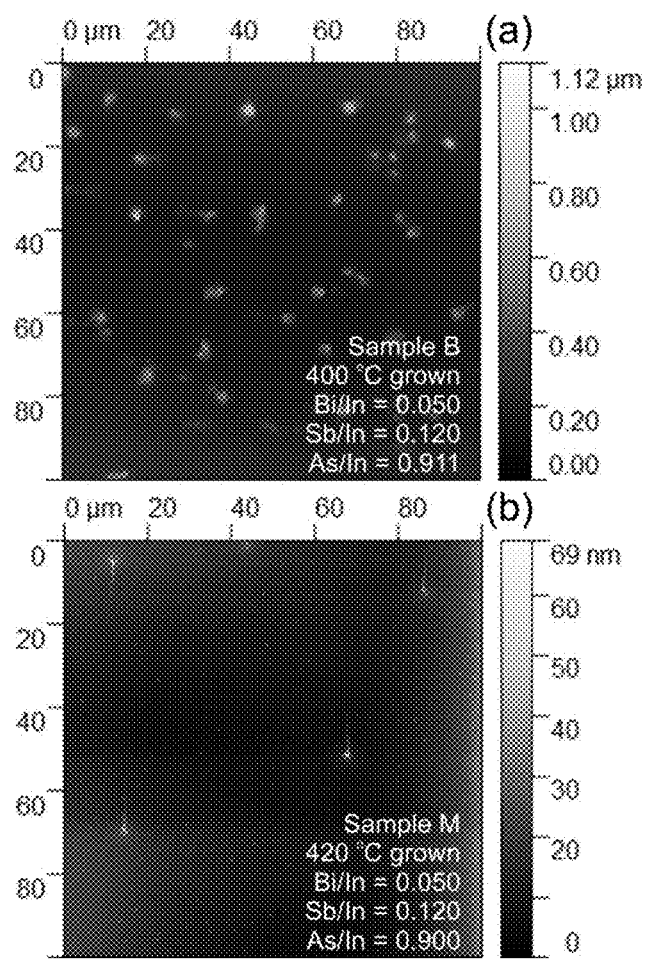
FIG. 4 shows unprocessed 100 μm by 100 μm atomic force microscopy images of (a) 400° C. grown sample B and (b) 420° C. grown sample M. Large, dense droplets are observed on the 400° C. grown samples B, C, and D. By contrast droplets on 420° C. grown sample M are small and sparse with a streaky morphology.

The six droplet-covered samples were investigated further using atomic force microscopy (AFM) to determine the total amount of Bi, $N_{Bi}$, accumulated in droplet features. The measurements were performed using a Brucker multimode 8 AFM with a lateral scan range of 153 μm and vertical scan range of 5.5 μm. Typical images are displayed in FIG. 4 for samples B and M. The images are 100 μm by 100 μm and were captured using ScanAsyst-AIR tips in the Bruker ScanAsyst-in-air imaging mode. The droplet morphology varied between samples with large droplets present on the 400° C. grown samples and small, sparse droplets on the 420° C. grown samples.

The measured images were flattened and corrected for probe streaking using the Gwyddion[28] image analysis software according to the procedure described in below in the section titled "*AFM Flattening Procedure*". This process converts the surface of the unprocessed image into a uniform plane on which the droplet features reside. The droplet features are then masked using height thresholding. The height threshold was 35 nm for 400° C. grown samples B, C, and D, while the threshold height varied from 4 to 10 nm for the 420° C. grown samples M, O, and Q. The volume contained within the masked droplets was then calculated in the Gwyddion software using a Laplacian background basis.[28] Dividing the total droplet volume by the image area of $10^4$ μm² yields the volume per unit area, $h_{droplet}$, contained within the droplet features. The droplet coverage statistics from the atomic force microscopy measurements are summarized in Table III.

TABLE III

Key droplet coverage statistics from atomic force microscopy analysis, including density, average area of a single droplet, fraction of surface covered by droplets, and volume per unit area contained by droplets. Only the bulk InAsSbBi samples which exhibited significant roughness under Nomarski optical microscopy are shown, The remaining samples were specular and did not exhibit droplet features.

| Sample | Growth temperature (° C.) | Droplet density (cm$^{-2}$) | Average droplet area (μm$^{-2}$) | Droplet surface coverage (%) | Droplet volume/unit area (nm) |
|---|---|---|---|---|---|
| B | 400 | 1.04 x 10$^6$ | 7.79 | 8.10 | 8.59 |
| C | 400 | 1.19 x 10$^6$ | 10.58 | 12.59 | 10.24 |
| D | 400 | 1.88 x 10$^6$ | 6.69 | 12.58 | 10.02 |
| M | 420 | 3.72 x 10$^6$ | 0.10 | 0.37 | 0.05 |
| O | 420 | 1.95 x 10$^7$ | 0.11 | 2.18 | 0.08 |
| Q | 420 | 1.11 x 10$^7$ | 0.09 | 1.04 | 0.08 |

Of the droplet covered samples, the ones grown at 400° C. (B, C, and D) had significantly more material on the surface in the form of droplets. Furthermore, for these three samples, the InAsSbBi layer thickness obtained from the dynamical simulations of the X-ray diffraction (XRD) pattern was significantly smaller than the growth target and hence indicates that in addition to excess Bi, a fraction of the incident In was consumed by the droplets during the Bi accumulation process. The loss of material was confirmed by thickness measurements from bright field transmission electron microscopy images[5] for all four bulk layers grown at 400° C. The InAsSbBi layer thickness measurements were compared in Table IV. For the smooth droplet-free 400° C. grown samples and for all 420° C. grown samples, the X-ray diffraction simulated thicknesses agree within ±4 nm of the target thicknesses, which lies within the precision of the measurement. This confirms that the incident In flux fully incorporated into the InAsSbBi layer of the droplet free samples and that there was no measurable decrease in the incorporation of In into the InAsSbBi layers of droplet covered samples M, O, and Q grown at 420° C. Therefore, the surface droplet features are thought to be composed of a mixture of metallic Bi and In with insignificant amounts of Sb and As for the growth at 400° C. Since no measurable In loss was observed in the droplet covered samples grown at 420° C., the droplets were considered to be comprised of Bi for calculation purposes.

the measured droplet accumulation rate $\theta_{Bi}R_{dro}$ listed in Table IV. Without loss of generality, all fluxes and rates are normalized to the incident In flux $F_{In}$. The growth model parameters $R_{des}$, $R_{inc}$, $P_{exc}$, $P_{rem}$, and $R_{dro}$ are independent adjustable parameters that are fit to the measured Bi, Sb, and As mole fractions and measured droplet accumulation rate. All processes are assumed to scale with the In flux and the rates $R_{des}$, $R_{inc}$, and $R_{dro}$ are normalized to the In flux such that they are expressed in dimensionless units where the In flux is one. The probabilities of anion-assisted exchange $P_{exc}$

TABLE IV

InAsSbBi layer thickness, volume per unit area of metallic In and Bi, total atomic density contained within droplet features, and Bi droplet accumulation rate relative to In flux. Droplet statistics are shown for droplet-covered samples B, C, D, M, O, and Q; all other samples were smooth and free of droplets. A significant amount of In was present in the droplets on the 400° C. grown samples. No measurable amount of In was present in the droplets on the 420° C. grown samples.

| Sample | Growth temperature (° C.) | InAsSbBi layer thickness (nm) Target | InAsSbBi layer thickness (nm) XRD | Difference, $h_{diff}$ | Volume/unit area (nm) In, $h_{In}$ | Volume/unit area (nm) Bi, $h_{Bi}$ | Total atomic density in droplets (cm$^{-2}$) In, $N_{In}$ | Total atomic density in droplets (cm$^{-2}$) Bi, $N_{Bi}$ | Measured Bi droplet accumulation rate, $\theta_{Bi}R_{dro}$ (dimensionless) |
|---|---|---|---|---|---|---|---|---|---|
| A | 400 | 210 | 210 | — | — | — | — | — | 0.00 |
| B | 400 | 210 | 194 | 16 | 7.35 | 1.24 | $2.82 \times 10^{16}$ | $3.49 \times 10^{15}$ | $9.45 \times 10^{-3}$ |
| C | 400 | 210 | 189 | 21 | 9.64 | 0.61 | $3.69 \times 10^{16}$ | $1.71 \times 10^{15}$ | $4.61 \times 10^{-3}$ |
| D | 400 | 210 | 190 | 20 | 9.20 | 0.82 | $3.53 \times 10^{16}$ | $2.30 \times 10^{15}$ | $6.22 \times 10^{-3}$ |
| E | 400 | 10 | 9.0 | — | — | — | — | — | 0.00 |
| F | 400 | 10 | 9.7 | — | — | — | — | — | 0.00 |
| G | 400 | 10 | 9.7 | — | — | — | — | — | 0.00 |
| H | 420 | 210 | 210 | — | — | — | — | — | 0.00 |
| I | 420 | 210 | 210 | — | — | — | — | — | 0.00 |
| J | 420 | 210 | 214 | — | — | — | — | — | 0.00 |
| K | 420 | 210 | 214 | — | — | — | — | — | 0.00 |
| L | 420 | 210 | 210 | — | — | — | — | — | 0.00 |
| M | 420 | 210 | 210 | — | — | 0.05 | — | $1.27 \times 10^{14}$ | $3.43 \times 10^{-4}$ |
| N | 420 | 210 | 210 | — | — | — | — | — | 0.00 |
| O | 420 | 210 | 214 | — | — | 0.08 | — | $2.23 \times 10^{14}$ | $6.02 \times 10^{-4}$ |
| P | 420 | 210 | 214 | — | — | — | — | — | 0.00 |
| Q | 420 | 210 | 214 | — | — | 0.08 | — | $2.28 \times 10^{14}$ | $6.17 \times 10^{-4}$ |

The X-ray diffraction measurements provide a reliable measurement of the layer thickness and were used to determine the fraction of In lost to the droplets. The loss of material relative to the 210 nm target thickness is 16, 21, and 20 nm for samples B, C, and D respectively. This thickness difference, $h_{diff}$, is due to metallic In accumulation in the droplet features. The total amount of In per unit area, $N_{In}$, accumulated in the droplets was calculated directly from the thickness difference. The corresponding amount of metallic Bi per unit area, $N_{Bi}$, contained within the droplets is given by the difference between the total volume per unit area of droplet features, $h_{droplet}$, from Table III and the metallic In volume per unit area, $h_{In}$. Finally, the measured rate of Bi accumulation in the droplets, $\theta_{Bi}R_{dro}$, was determined by dividing the amount of metallic Bi per unit area by the incident In flux. Table IV summarizes the InAsSbBi layer thickness, volume per unit area of metallic In and Bi, the total amount of In and Bi per unit area, and the measured Bi droplet accumulation rate, $\theta_{Bi}R_{dro}$, expressed in dimensionless units where the In flux is one. The calculation details are shown in the section below titled Calculation of Droplet Accumulation Rate.

Growth Model Fitting

The inputs to the steady state kinetic growth model embodied by Eqs. 3 and 4 are the growth temperature, Bi/In, Sb/In, and As/In flux ratios, and excess Bi/In, Sb/In, and As/In flux ratios ($\Delta F_{As}$, $\Delta F_{Sb}$, and $\Delta F_{Bi}$) listed in Table I, and and removal $P_{rem}$ are restricted to be between zero and one in the fit. The best fit values for the rates $R_{des}$, $R_{inc}$, and $R_{dro}$ are restricted to be greater than or equal to zero.

The average droplet accumulation rate $R_{dro}$ was determined self-consistently from the measured droplet accumulation rate $\theta_{Bi}R_{dro}$ listed in Table IV and the modeled Bi surface coverage $\theta_{Bi}$ given by Eq. 3. Because the Bi surface coverage depends on the model parameters, an iterative process was utilized wherein the growth model parameters $R_{des}$, $R_{inc}$, $P_{exc,As}$, $P_{exc,Sb}$, $P_{rem,As}$, and $P_{rem,Sb}$ were fit to the Bi mole fraction data as described below, the Bi surface coverage $\theta_{Bi}$ is calculated for each sample, and the average droplet uptake rate $R_{dro}$ was calculated from the measured droplet accumulation rates using $$R_{dro} = \frac{1}{N}\sum_{i=1}^{N} \frac{\theta_{Bi}R_{dro}[i]}{\theta_{Bi}[i]}, \qquad (8)$$

where $\theta_{Bi}R_{dro}[i]$ is the measured droplet accumulation rate and $\theta_{Bi}[i]$ is the modeled Bi surface coverage of the i-th droplet covered sample at each growth temperature. An absolute tolerance of $10^{-5}$ (normalized to the In flux) on the average droplet accumulation rate $R_{dro}$ and initial guess of $\theta_{Bi}=0.2$ was used, resulting in rapid convergence of the droplet accumulation rates.

The probabilities of anion-assisted exchange and removal were modeled as temperature independent parameters for each of the group-V elements, as these processes were not expected to depend on temperature. On the other hand, the incorporation and the self-desorption rates for Bi, Sb, and As were temperature dependent parameters. In particular, the incorporation of Bi into the growing crystal was observed to be strongly dependent on temperature.[1]

The modeling work indicated that the temperature dependence of the incorporation and desorption rates are correlated in the fit. Therefore, to attain a unique temperature dependence for each, the temperature dependence of the incorporation rate was fixed at that observed for the measured incorporation coefficients. The ratio $R_{inc}(420)/R_{inc}(400)$ of the 420 to 400° C. incorporation rates for Bi, Sb, and As were set at 26.1%, 98.5%, and 99.0% respectively, which are the ratios of the average values of the incorporation coefficients provided in Table II. The temperature dependence of the self-desorption rates was determined from the fit of the model to the experimental data. As a result, there is a total of 23 independently adjustable parameters fit to the Bi, Sb, and As mole fractions of the 17 samples. The independently adjustable parameters for each group-V element are $R_{des}(400)$, $R_{des}(420)$, $R_{inc}(400)$, $P_{exc,As}$, $P_{exc,Sb}$, $P_{rem,As}$, and $P_{rem,Sb}$, with $R_{inc}(420)$ determined separately from the temperature dependence of the incorporation coefficients. The Bi droplet uptake rates $R_{dro}(400)$ and $R_{dro}(420)$ were determined separately from the analysis of the droplet covered samples.

Fitting to the mole fractions is accomplished using the fmincon nonlinear least-squares fitting function in MATLAB R2020a.[29] The objective function to be minimized by fmincon is the squared error between measured and modeled group-V mole fractions, weighted by the uncertainty in each measured group-V mole fraction $$\chi^2 = \chi_{Bi}^2 + \chi_{Sb}^2 + \chi_{As}^2 = \sum_{i=1}^{N}\left[\frac{(x_i - \hat{x}_i)^2}{\sigma_{Bi,i}^2} + \frac{(y_i - \hat{y}_i)^2}{\sigma_{Sb,i}^2} + \frac{(z_i - \hat{z}_i)^2}{\sigma_{As,i}^2}\right], \quad (9)$$

where $x_i$, $y_i$, and $z_i$ are the measured Bi, Sb, and As mole fractions for the i-th sample, $\hat{x}_i$, $\hat{y}_i$, and $\hat{z}_i$ are the modeled Bi, Sb, and As mole fractions, and $\sigma_{Bi,i}$, $\sigma_{Sb,i}$, and $\sigma_{As,i}$ are the Bi, Sb, and As mole fraction uncertainties reported in Table II.

In the model fit the measured mole fractions sum to unity, with $x_i+y_i+z_i=1$, and modeled mole fractions for the best fit parameters sum to be near unity within an uncertainty of −2.3% to +2.1%. Since the samples were grown under group-V rich conditions, where very few surface layer vacancies or group-III elements were expected, the surface coverage fractions were constrained to be near unity in the model. In practice it is not possible to find a set of model parameters that exactly satisfy the unity surface coverage constraint for each of the 17 samples examined. Therefore, a surface coverage fraction range of $0.9 \leq \theta_{Bi}+\theta_{Sb}+\theta_{As} \leq 1.1$ was implemented as a nonlinear constraint in MATLAB's fmincon function.

A satisfactory fit quality is difficult to acquire as the number of fitting parameters increases. Therefore, the fit options must be judiciously chosen so a good fit is achieved. The default 'interior-point' algorithm provided by MATLAB was used as it handles bounds on the fitting parameters. The fit options included limits, tolerances, and iterations are shown in Table V.

TABLE V

Fit options specified for the fmincon function.
Fit options not listed use the default values provided in MATLAB R2020a.[30]

| Fit option | Value |
| --- | --- |
| options.Algorithm | Interior-point |
| options.ObjectiveLimit | 1e-20 |
| options.OptimalityTolerance | 1e-7 |
| options.StepTolerance | 1e-12 |
| options.MaxFunctionEvaluations | 1e4 |
| options.MaxIterations | 2e3 |
| options.ConstraintTolerance | 1e-6 |

Stochastic initialization was used to locate the global minimum of the fit. A set of 1000 initial conditions was randomly generated for the growth model parameters. The fitting algorithm was iterated for each of the 1000 sets of initial conditions and the minimized least-squared error given by Eq. 9 was evaluated. A global minimum of $\chi^2=160.09$ for the combined 400° C. and 420° C. sample set was identified. The individual sums of squared residuals for Bi, Sb, and As were $\chi_{Bi}^2=6.13$, $\chi_{Sb}^2=20.05$, and $\chi_{As}^2=133.92$. The best fit parameters are summarized in Table VI.

TABLE VI

Best-fit growth model parameters, based on the globally minimized least-squared error for Bi, Sb, and As mole fractions.

| Bismuth | Rates (relative to Influx) | | | Probabilities | | | |
| --- | --- | --- | --- | --- | --- | --- | --- |
| parameters | $R_{des}$ | $R_{inc}$ | $R_{dro}$ | $P_{exc, As}$ | $P_{exc, Sb}$ | $P_{rem, As}$ | $P_{rem, Sb}$ |
| 400° C. growth | 0.3992 | 0.1246 | 0.0669 | 0.7816 | 0.2019 | 0.7013 | 0.4381 |
| 420° C. growth | 0.6878 | 0.0325 | 0.0053 | | | | |
| Antimony | Rates (relative to Influx) | | | Probabilities | | | |
| parameters | $R_{des}$ | $R_{inc}$ | $R_{dro}$ | $P_{exc, As}$ | $P_{exc, Bi}$ | $P_{rem, As}$ | $P_{rem, Bi}$ |
| 400° C. growth | 0.1078 | 0.7975 | — | 0.2125 | 0.1185 | 0.6567 | 0.4501 |
| 420° C. growth | 0.1116 | 0.7856 | — | | | | |

TABLE VI-continued

Best-fit growth model parameters, based on the globally minimized least-squared error for Bi, Sb, and As mole fractions.

| Arsenic parameters | Rates (relative to Influx) | | | Probabilities | | | |
|---|---|---|---|---|---|---|---|
| | $R_{des}$ | $R_{inc}$ | $R_{dro}$ | $P_{exc, Sb}$ | $P_{exc, Bi}$ | $P_{rem, Sb}$ | $P_{rem, Bi}$ |
| 400° C. growth | 0.0242 | 1.3891 | — | 0.0265 | 0.0015 | 0.0732 | 0.0333 |
| 420° C. growth | 0.0351 | 1.3752 | — | | | | |

Allowing the other model parameters, such as the probabilities of anion-assisted exchange or removal, to vary with growth temperature results in marginal reductions of less than 1% in the normalized sum of residuals $\chi^2$. However, in such cases the best-fit values of the parameters vary orders of magnitude from 400° C. to 420° C. which is not a physically plausible or interpretable result. Therefore, only the desorption rate $R_{des}$, incorporation rate $R_{inc}$, and Bi droplet accumulation rate $R_{dro}$ are allowed to vary with temperature.

Figure 5:
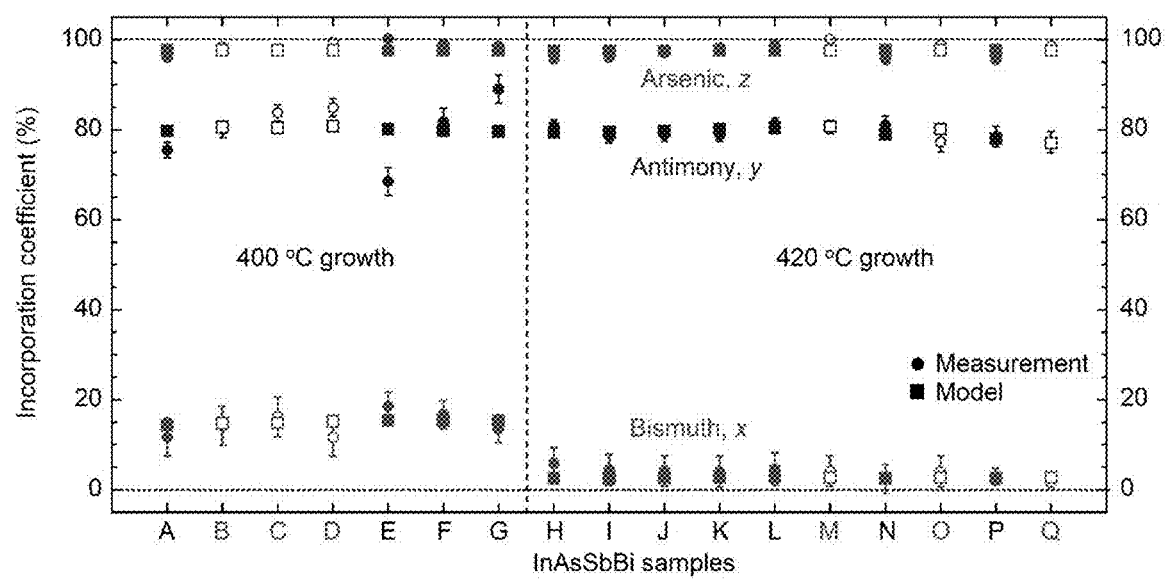
FIG. 5 shows the measured (circles) and model predicted (squares) bismuth (red), antimony (blue), arsenic (green) incorporation coefficients for the 400° C. and 420° C. grown InAsSbBi sample sets. Solid symbols indicate specular droplet-free samples while open symbols indicate droplet-covered samples. Error bars on measured incorporation coefficients are the uncertainties reported in Table II divided by the V/In flux ratios in Table I.

The measured and modeled incorporation coefficients are shown in FIG. 5 as circles and squares respectively for Bi (in red), Sb (in blue), and As (in green). The incorporation coefficient is defined as mole fraction divided by V/In flux ratio and is the most relevant quantity for molecular beam epitaxy growth, as the desired group-V mole fractions are established by specifying the product of the incorporation coefficient and the V/In flux ratio. Solid symbols indicate specular droplet-free samples and open symbols indicate rough droplet-covered samples. Error bars on the measured group-V incorporation coefficients are the uncertainties a as reported in Table II divided by the V/In flux ratios in Table I. The measured Bi incorporation coefficients range from 1.7% for 210 nm thick bulk InAsSbBi grown at 420° C. (sample Q) to 18.6% for a 10 nm thick InAsSbBi quantum well (sample E) grown at 400° C. The model replicates the measured Bi incorporation coefficients to within the mole fraction measurement uncertainty for each InAsSbBi sample.

Figure 6:
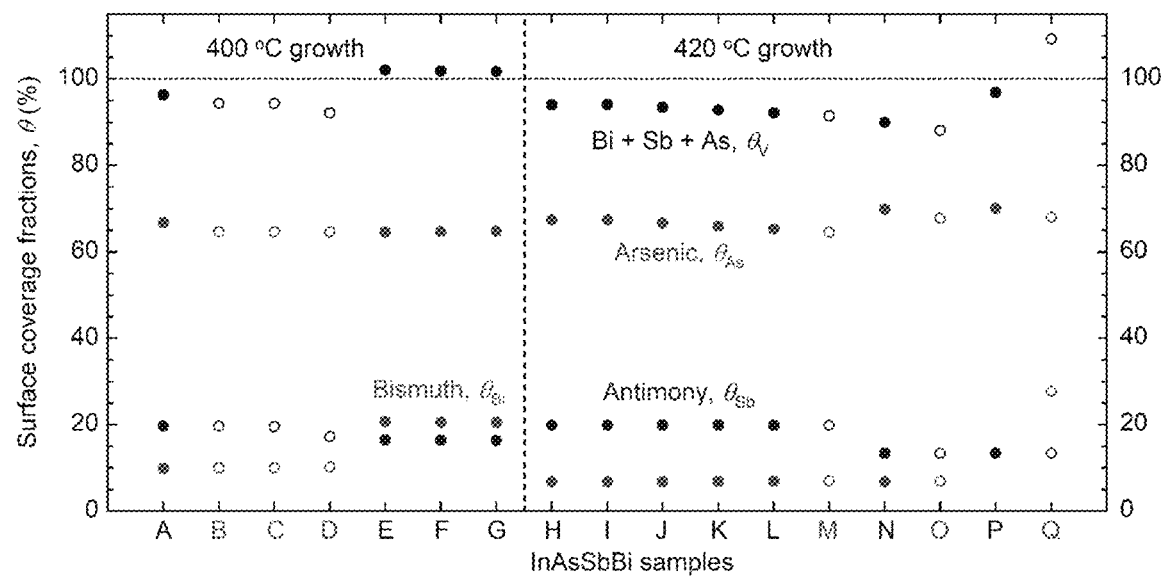
FIG. 6 shows the model predicted bismuth (red), antimony (blue), arsenic (green), and total group-V (black) surface coverage fractions for 400° C. and 420° C. grown InAsSbBi sample set. The solid circles indicate specular droplet-free samples and the open circles indicate droplet-covered samples.

The steady state Bi, Sb, and As surface coverage fractions predicted by the model are shown in FIG. 6. The solid circles indicate droplet-free specular samples and the open circles indicate droplet-covered rough samples. The total group-V surface coverage fractions indicated by the black symbols range between 90% and 110%, which are the constraint limits employed in the fitting routine. The surface coverage fractions are approximately proportional to the Bi/In, Sb/In, and As/In flux ratio for all samples. The steady state Bi surface coverage fraction is slightly smaller for droplet covered samples where the droplet accumulation rate $R_{dro}$ reduces the surface coverage. A trend of increasing Bi surface coverage with decreasing As flux is observed in the 420° C. grown bulk sample series H through M, confirming the dominant role of As flux in desorbing Bi from the growth surface.

Interestingly, As is predicted to occupy the largest fraction of the surface layer, with Sb and Bi occupying roughly comparable fractions of 10 to 20%. This is consistent with RHEED (reflection high-energy electron diffraction) patterns that indicate As-terminated (2×4) surface reconstructions for growth of InAs that changes to an Sb-terminated (2×3) reconstruction for growth of InAsSb and back to an As-like (2×4) or (2×1) surface reconstruction when the Bi flux is introduced during the growth of InAsSbBi.[1,6] The growth model suggests that in all three cases the surface reconstruction is dominated by the presence of a comparatively large amount of As on the adsorbed surface layer.

The outputs of the growth model provided by Eqs. 3 and 4 are the Bi, Sb, and As mole fractions and surface coverages. These values are provided in Table VII for each of the 17 samples examined.

TABLE VII

InAsSbBi sample cross section, growth temperature, model predicted group-V mole fractions, and model predicted group-V surface coverages. The "Bulk" cross section is the 210 nm thick InAsSbBi layer shown in FIG 3a. The "QW" cross section is the 10 nm thick InAsSbBi quantum well shown in FIG 3b.

| Sample | Cross section | Growth temperature (° C.) | Model predicted mole fraction (%) | | | | Model predicted surface coverage (%) | | | |
|---|---|---|---|---|---|---|---|---|---|---|
| | | | Bi, $\hat{x}$ | Sb, $\hat{y}$ | As, $\hat{z}$ | Total | Bi, $\theta_{Bi}$ | Sb, $\theta_{Sb}$ | As, $\theta_{As}$ | Total |
| A | Bulk | 400 | 0.72 | 9.57 | 91.77 | 102.06 | 9.87 | 19.67 | 66.76 | 96.30 |
| B | Bulk | 400 | 0.74 | 9.66 | 88.95 | 99.35 | 10.04 | 19.64 | 64.70 | 94.38 |
| C | Bulk | 400 | 0.74 | 9.65 | 88.96 | 99.35 | 10.07 | 19.61 | 64.71 | 94.39 |
| D | Bulk | 400 | 0.76 | 8.48 | 88.97 | 98.21 | 10.26 | 17.23 | 64.65 | 92.14 |
| E | QW | 400 | 1.54 | 8.01 | 88.93 | 98.48 | 20.85 | 16.51 | 64.71 | 102.07 |
| F | QW | 400 | 1.53 | 7.98 | 88.96 | 98.47 | 20.65 | 16.45 | 64.72 | 101.82 |
| G | QW | 400 | 1.52 | 7.97 | 88.97 | 98.46 | 20.58 | 16.42 | 64.73 | 101.73 |
| H | Bulk | 420 | 0.13 | 9.52 | 91.76 | 101.41 | 6.73 | 19.87 | 67.42 | 94.02 |
| I | Bulk | 420 | 0.13 | 9.53 | 91.76 | 101.42 | 6.75 | 19.89 | 67.42 | 94.06 |
| J | Bulk | 420 | 0.13 | 9.57 | 90.78 | 100.48 | 6.82 | 19.90 | 66.70 | 93.42 |
| K | Bulk | 420 | 0.13 | 9.61 | 89.81 | 99.55 | 6.90 | 19.91 | 65.99 | 92.80 |
| L | Bulk | 420 | 0.13 | 9.64 | 88.83 | 98.60 | 6.95 | 19.89 | 65.27 | 92.11 |
| M | Bulk | 420 | 0.14 | 9.68 | 87.86 | 97.68 | 7.02 | 19.89 | 64.55 | 91.46 |

TABLE VII-continued

InAsSbBi sample cross section, growth temperature, model predicted group-V mole fractions, and model predicted group-V surface coverages. The "Bulk" cross section is the 210 nm thick InAsSbBi layer shown in FIG 3a. The "QW" cross section is the 10 nm thick InAsSbBi quantum well shown in FIG 3b.

| Sample | Cross section | Growth temperature (° C.) | Model predicted mole fraction (%) | | | | Model predicted surface coverage (%) | | | |
|---|---|---|---|---|---|---|---|---|---|---|
| | | | Bi, $\hat{x}$ | Sb, $\hat{y}$ | As, $\hat{z}$ | Total | Bi, $\theta_{Bi}$ | Sb, $\theta_{Sb}$ | As, $\theta_{As}$ | Total |
| N | Bulk | 420 | 0.13 | 6.32 | 95.39 | 101.84 | 6.73 | 13.38 | 69.89 | 90.00 |
| O | Bulk | 420 | 0.13 | 6.41 | 92.46 | 99.00 | 6.95 | 13.41 | 67.74 | 88.10 |
| P | Bulk | 420 | 0.25 | 6.24 | 95.38 | 101.87 | 13.45 | 13.40 | 70.00 | 96.85 |
| Q | Bulk | 420 | 0.53 | 6.16 | 92.43 | 99.12 | 27.75 | 13.43 | 68.06 | 109.24 |

Discussion of Results

It is evident from the growth model parameters listed in Table VI that the group-V incorporation rates and the droplet accumulation rates of Bi decrease with increasing growth temperature while the desorption rates increase. The results indicate thermally-activated behavior for the Bi desorption, incorporation, and droplet accumulation rates, consistent with the literature.[10-12] The temperature dependence of Bi self-desorption is approximately twice as large as that of the Bi incorporation rate, which in turn is approximately twice as large as that of the accumulation rate of Bi into surface droplets, when present. The result is that the fraction of Bi incorporated increases quickly as the growth temperature is decreased, consistent with experimental growth of dilute bismide alloys including InAsSbBi,[1,2] InAsBi,[6] GaAsBi[8,10, 12], and GaSbBi.[4,30]

Figure 7:
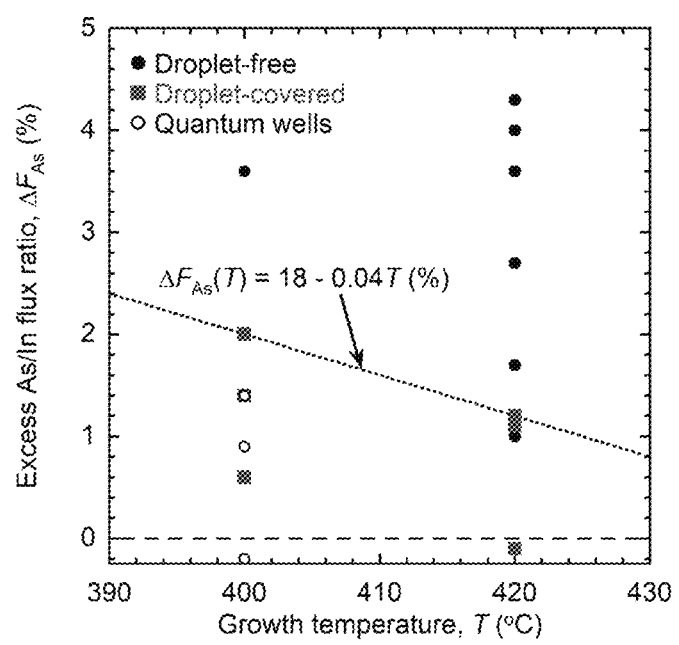
FIG. 7 shows the excess As/In flux ratio as a function of growth temperature. Data points indicate droplet-free bulk samples as black circles, droplet-covered bulk samples as red squares, and the droplet-free quantum well samples as open circles. The excess As flux threshold for droplet formation is shown by a dashed line and equation. Growth of InAsSbBi with excess As flux below this threshold is expected to result in Bi-rich surface droplet formation.

The presence of Bi- and In-rich surface droplets is generally considered detrimental to the physical and optical quality of the material.[4-6,31] The excess As/In flux ratio for all samples is shown in FIG. 7 as a function of growth temperature, where the droplet covered samples are indicated as solid red squares. The results indicate that surface droplets form when the excess As flux is below 2.0% and 1.2% at 400° C. and 420° C. respectively. This yields a region for droplet formation as a function of growth temperature, given by $$\Delta F_{As}(T) \leq 18 - 0.04T(\%). \quad (10)$$

The threshold for droplet accumulation is shown by the dotted line and equation. The 10 nm quantum well growths shown as open circles are the exception as the growth has yet to reach the steady state for droplet accumulation.

As noted, the droplets observed on 400° C. grown samples B, C, and D are composed primarily of In, which is likely a result of growth for an extended duration at low As and Sb overpressures. Group III rich droplet formation is known to occur for molecular beam epitaxy growth of bismide alloys at unity or very slightly group-V rich V/III flux ratios.[31] In particular, the strong interaction of As and Bi on the surface likely starves the surface of As that would otherwise incorporate, which results in the presence of excess In on the surface that coalesces into droplet features with the Bi. At the higher growth temperature, there is significant increase in surface Bi desorption and the accumulation of Bi in droplets is significantly reduced.

As the atomic number decreases from Bi to Sb to As, the rate of desorption is observed to decrease and the rate of incorporation is observed to increase. This trend in the competition for group-V sublattice sites was also observed during the growth of InAsSb,[1,2,18] and is consistent with the theoretically predicted decrease in solid solubility[9] with atomic size. Likewise, the increase in desorption rate from As to Sb to Bi is consistent with the increase in vapor pressure with atomic number at typical molecular beam epitaxy growth pressures.[15]

The As-assisted removal mechanism plays a dominant role in the desorption of Bi from the surface, as evident from the high probability $P_{rem,As}$ of the removal of Bi via excess As flux. Therefore, the regulation of the excess As flux is important in limiting the accumulation of excessive Bi on the surface and its subsequent segregation into droplet features. Additionally, As is observed to displace Bi from the crystal termination layer with a high probability $P_{exc,As}$, limiting the net incorporation of surface Bi. In contrast, the Sb assisted removal and exchange of Bi is minor, with little effect on the surface coverage and incorporation.

The steady state growth model embodied by Eqs. 3 and 4 can be utilized to specify the molecular beam epitaxy growth conditions to grow bulk InAsSbBi with a desired composition. The three systems of equations for Bi, Sb, and As are invertible, in that the Bi/In, Sb/In, and As/In flux ratios can be calculated for a given InAsSbBi composition x, y, and z. Furthermore, the system of equations is one-to-one in that a single set of flux ratios exists for a given InAsSbBi composition. Vegard's Law yields the relation between the Bi mole fraction x, Sb mole fraction y, and the in-plane biaxial strain $\varepsilon_{xx}$ for pseudomorphic InAsSbBi grown on GaSb,[1] with $$y = 0.0893 - 1.3120x - 14.4763\frac{\varepsilon_{xx}}{1+\varepsilon_{xx}}. \quad (11)$$

Figure 8:
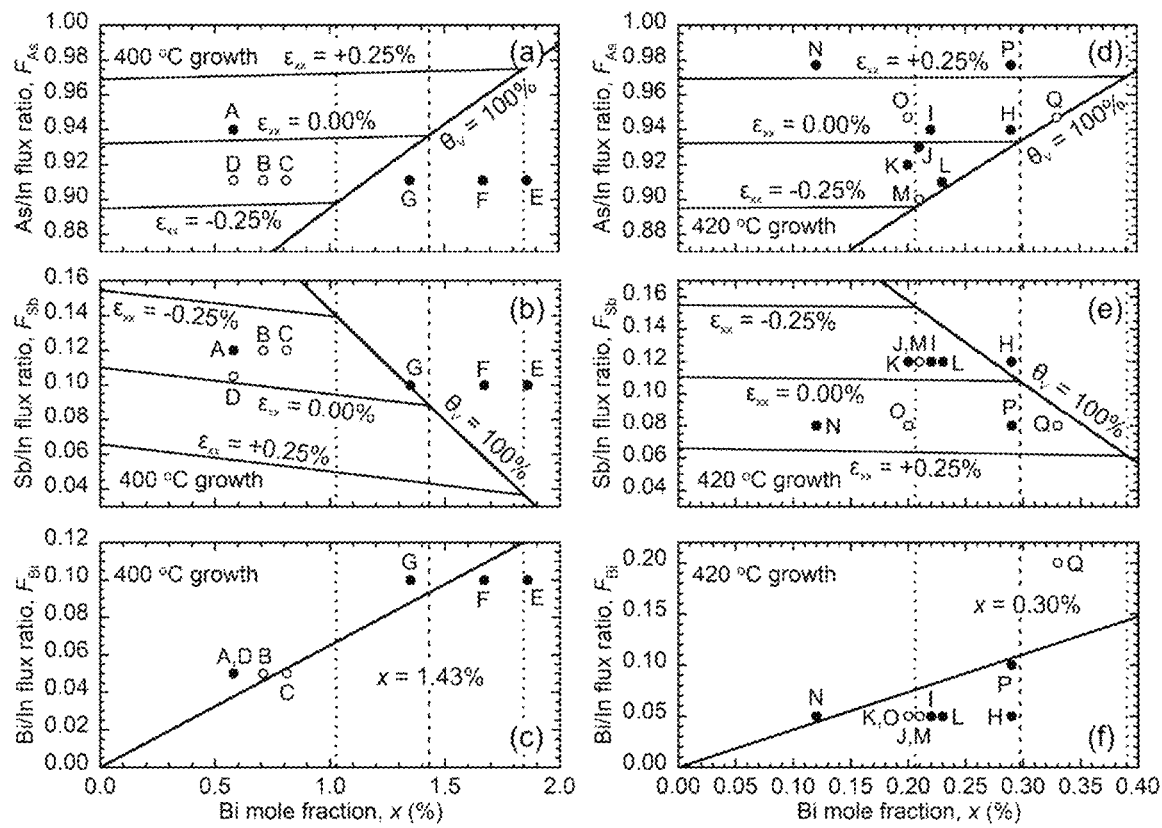
FIG. 8 shows group-V flux ratios for the growth of InAsSbBi on GaSb as a function of Bi mole fraction, for 400° C. growths in left hand plots and 420° C. growths in right hand plots. The solid lines are contours of constant in-plane biaxial strain $\varepsilon_{xx}$=0.00%, −0.25%, and +0.25%. The dashed vertical lines indicate the ultimate Bi mole fractions for lattice-matched growth with $\varepsilon_{xx}$=0.00%; dotted vertical lines indicate the Bi mole fractions for strained growth with $\varepsilon_{xx}$=−0.25% and +0.25%. The measured flux ratios provided in Table I are shown as solid circles for droplet-free specular surfaces and by open circles for droplet-covered samples. (a) and (d) As/In flux ratios, (b) and (e) Sb/In flux ratios, and (c) and (f) Bi/In flux ratios.

The As/In, Sb/In, and Bi/In flux ratios as a function of Bi mole fraction are shown in FIG. 8. The solid black lines are contours of constant biaxial strain ranging from lattice-matched to 0.25% compressive or tensile. The flux ratios for each sample (see Table I) are also shown, with the droplet-free specular samples indicated by solid circles and the droplet-covered samples indicated by the open circles. The rightmost boundary contour corresponds to unity group-V surface coverage with $\theta_{Bi}+\theta_{Sb}+\theta_{As}=\theta_V=1$. When interpreted as the fraction of the growth surface covered by adsorbed Bi, Sb, and As, the total surface coverage ranges between zero and one. At unity coverage, an increase in a given group-V flux as a means to increases its incorporation must result in the displacement of the other surface elements to succeed. Otherwise, the added flux either desorbs or condenses in the form of droplets external to the surface layer states.

The vertical dashed lines indicate the Bi mole fraction corresponding to unity total group-V surface coverage for lattice-matched InAsSbBi. This mole fraction is 1.43% and 0.30% for growth at 400° C. and 420° C. respectively. The model shows that larger Bi mole fractions are achievable for tensile strained material. The three quantum well samples E, F, and G lie outside the unity group-V coverage boundary, a consequence of the quasi steady-state growth conditions where droplet uptake of excess surface Bi has yet to occur. Higher concentrations of Bi are accessible in quantum wells as larger Bi fluxes can be used for short durations without the detrimental formation of surface droplets.

Since the Bi incorporation coefficient is observed to depend exponentially on growth temperature over the temperature range of interest, the growth model is extended to lower and higher temperatures by assuming the same functional form. The temperature dependent incorporation rate parameters and desorption rate parameters are respectively given as $$R_{inc}(T) = R_{inc}(400)e^{-\frac{(T-400)}{T_{inc}}}, \quad (12)$$

$$R_{des}(T) = R_{des}(400)e^{\frac{(T-400)}{T_{des}}}, \quad (13)$$

with characteristic temperatures for incorporation $T_{inc}$=14.88° C., 1325° C., and 1986° C. and desorption $T_{des}$=36.76° C., 577.3° C., and 53.79° C. for Bi, Sb, and As respectively, as determined from the 400° C. and 420° C. parameters in Table VI. The characteristic temperatures generally decrease with atomic number.

Figure 9:
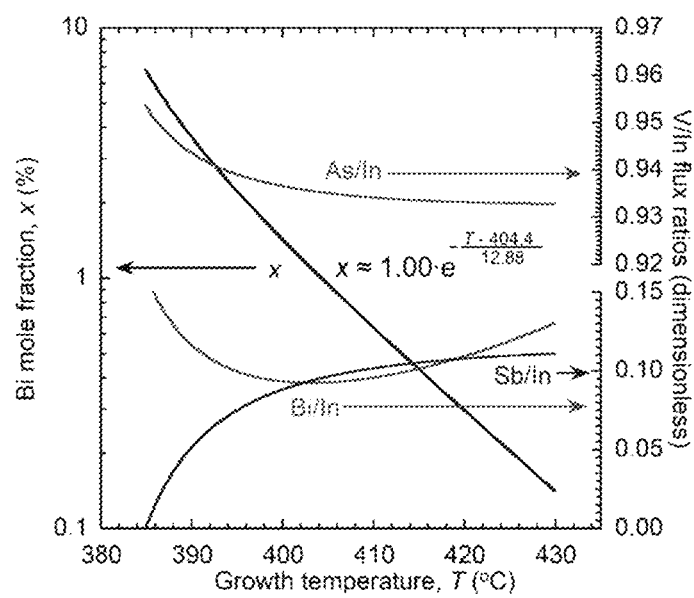
FIG. 9 shows a plot of ultimate Bi mole fraction limit (black curve) and corresponding flux ratios for Bi/In (red curve), Sb/In (blue curve), and As/In (green curve) as a function of growth temperature for InAsSbBi lattice-matched to GaSb. The Bi mole fraction decays approximately exponentially with growth temperature and a characteristic temperature of 12.88° C. as shown by the fit equation.

The model predicted limit for the Bi mole fraction in lattice-matched bulk InAsSbBi as a function of growth temperature is shown in FIG. 9 as a solid black curve. The group-V surface coverage is unity and the required group-V flux ratios are shown as solid curves, with red for Bi/In, blue for Sb/In, and green for As/In. The Bi mole fraction limit decays approximately exponentially with growth temperature, with a characteristic temperature of 12.88° C. from 3.66% at 390° C. to 0.14% at 430° C. The required Bi/In flux ratio increases from 0.102 at 390° C. to 0.125 at 430° C. The result indicates that the growth temperature must be reduced to ≤385° C. to obtain the lattice-matched ternary InAs$_{0.932}$Bi$_{0.068}$ on GaSb.

The growth model is generalizable to other dilute bismide alloys including GaSbBi, InAsBi, GaAsBi, and GaAsSbBi, among others. However as presented, the growth model is linear with respect to the group-V fluxes and is only applicable to growths that utilize small flux overpressures. The model would need to be modified to include the nonlinearities that exist in the group-V desorption when large flux overpressures are used. Nevertheless, the linear model is a useful tool for predicting the incorporation of Bi over the typical range of group-V fluxes used to grow dilute bismide alloys.

EXAMPLES

Example 1

Predicting Group V Mole Fractions Given Growth Temperature and Fluxes as Inputs

Figure 12:
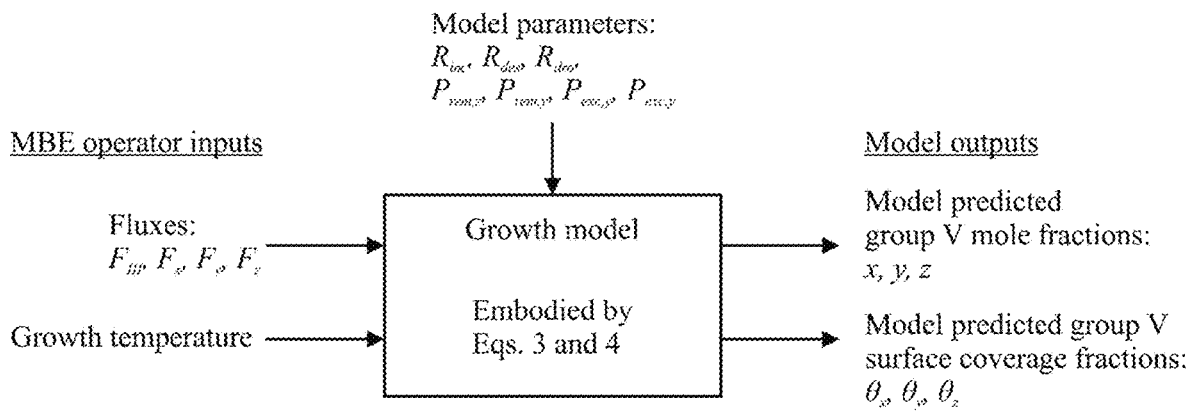
FIG. 12 is a schematic illustrating the process by which the growth model is used to predict the group V mole fractions and surface coverage fractions for a III-V alloy given the growth temperature and group III and group V fluxes as inputs.

In this example, the mole fractions x, y, and z of a III-V alloy are predicted by the model given inputs of growth temperature and group III and group V fluxes $F_{III}$, $F_x$, $F_y$, and $F_z$. The MBE grower/operator specifies the growth temperature and fluxes as inputs to the growth model embodied by Eqs. 3 and 4. The model parameters $R_{inc}$, $R_{des}$, $R_{dro}$, $P_{exc,y}$, $P_{exc,z}$, $P_{rem,y}$, and $P_{rem,z}$ are determined either experimentally or theoretically and their values are known. The growth model outputs the predicted group V mole fractions x, y, and z and the predicted group V surface coverage fractions $\theta_x$, $\theta_y$, and $\theta_z$. The process is illustrated schematically in FIG. 12.

Example 2

Figure 13:
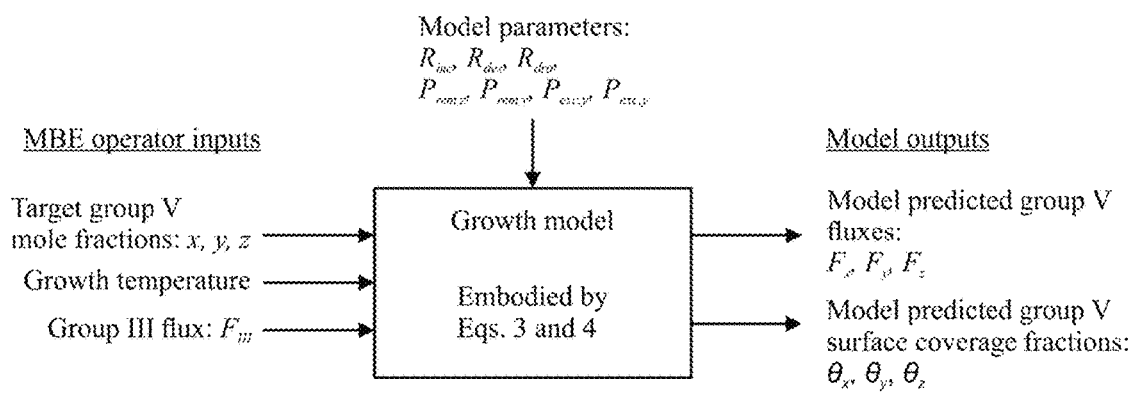
FIG. 13 is a schematic illustrating the process by which the growth model is used to predict the group V flux setpoints and group V surface coverage fractions for a III-V alloy given the growth temperature, group III flux, and target group V mole fractions as inputs.

Predicting Group V Flux Setpoints Given Growth Temperature, Group III Flux, and Group V Mole Fractions as Inputs In this example, the group V flux setpoints $F_x$, $F_y$, and $F_z$ are predicted by the model given inputs of growth temperature, group III flux, and target group V mole fractions x, y, and z for a III-V alloy. Conceptually, this is equivalent to reversing the process illustrated in Example 1 by inverting the growth model. The MBE grower/operator specifies the growth temperature, group III flux, and target mole fractions as inputs. The model parameters $R_{inc}$, $R_{des}$, $R_{dro}$, $P_{exc,y}$, $P_{exc,z}$, $P_{rem,y}$, and $P_{rem,z}$ are determined either experimentally or theoretically and their values are known. The growth model outputs the group V flux setpoints $F_x$, $F_y$, and $F_z$ to achieve the target mole fractions. Additionally, the group V surface coverage fractions $\theta_x$, $\theta_y$, and $\theta_z$ are provided as an output. The process is illustrated schematically in FIG. 13.

Example 3

Figure 14:
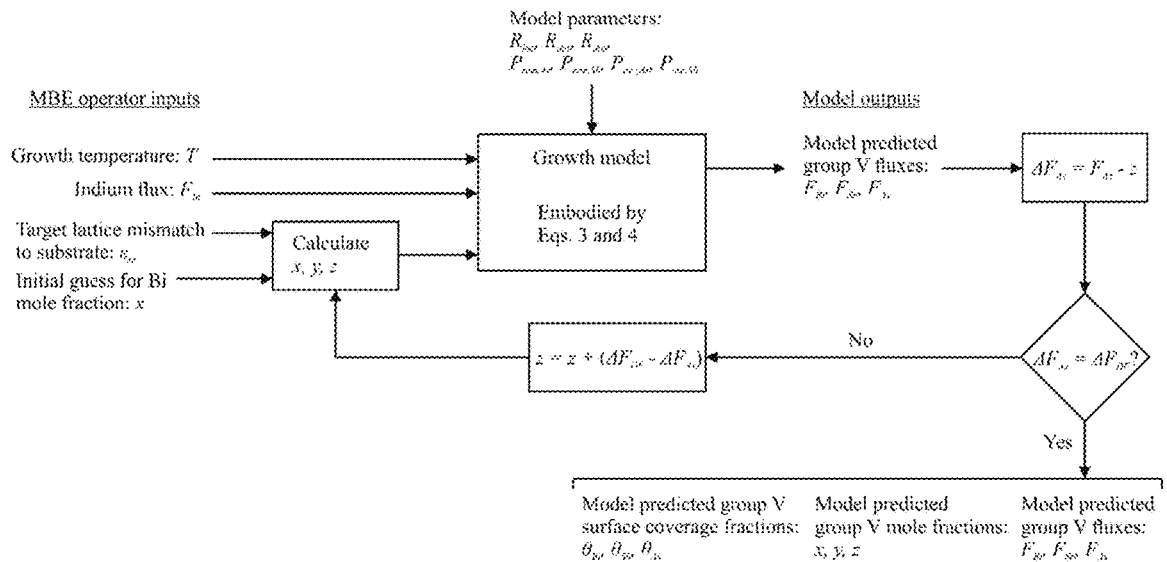
FIG. 14 is a schematic illustrating the iterative process for maximizing Bi incorporation in droplet-free InAsSbBi at a user specified growth temperature and target lattice mismatch to the substrate.

Maximizing Bi Incorporation in Droplet-Free InAsSbBi Given Growth Temperature and Lattice Mismatch to Substrate as Inputs In this example, the growth model is used to find a set of group V fluxes, mole fractions, and surface coverage fractions corresponding to the maximum achievable Bi incorporation in droplet-free InAsSbBi. This is achieved when the excess As flux $\Delta F_{As}$ matches the boundary value $\Delta F_{DF}$ for droplet-free growth illustrated in FIG. 7 and given by the relation $\Delta F_{DF}(T)=18-0.04T$ (%), where T is the growth temperature. This corresponds to the minimum As overpressure required to maintain droplet-free growth of InAsSbBi. The MBE grower/operator specifies the growth temperature, In flux $F_{In}$, and target lattice mismatch (in-plane strain) $\varepsilon_{xx}$ to the substrate as inputs. Additionally, an initial guess for one of the group V mole fractions (e.g. Bi mole fraction, x) is supplied. The group V mole fractions are calculated from the in-plane strain and initial mole fraction guess. The model parameters $R_{inc}$, $R_{des}$, $R_{dro}$, $P_{exc,y}$, $P_{exc,z}$, $P_{rem,y}$, and $P_{rem,z}$ are determined either experimentally or theoretically and their values are known. The growth model embodied by Eqs. 3 and 4 is used to calculate the group V fluxes, similar to Example 2. The excess As flux is computed, and the error between excess As flux and droplet-free excess As flux $\Delta F_{DF}-\Delta F_{As}$ is added to the As mole fraction z. This updated value for As mole fraction is used to recalculate the group V mole fractions, and the process is iterated until the excess As flux $\Delta F_{As}$ converges on the droplet-free excess As flux $\Delta F_{DF}$. The resulting growth model solution provides the group V mole fractions x, y, and z, fluxes $F_{Bi}$, $F_{Sb}$, and $F_{As}$, and surface coverage fractions $\theta_{Bi}$, $\theta_{Sb}$, and $\theta_{As}$ corresponding to the maximum possible Bi incorporation for droplet-free InAsSbBi with the specified lattice mismatch to the substrate. The process is illustrated schematically in FIG. 14.

Example 4

Targeting InAsSbBi Composition for Droplet Free Growth

Figure 15:
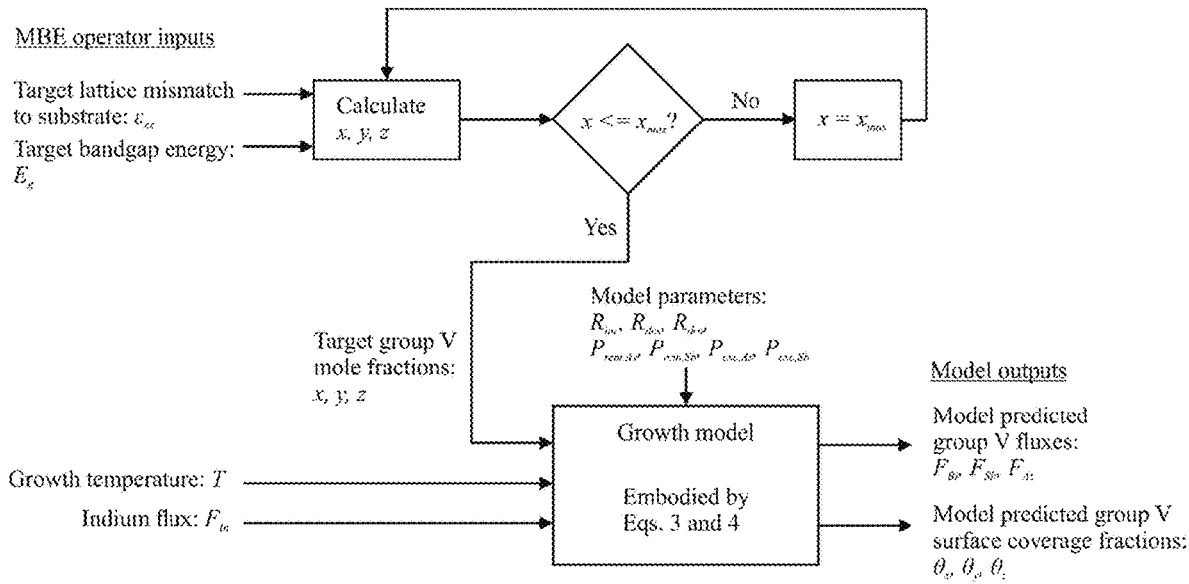
FIG. 15 is a schematic illustrating the process for determining growth conditions for droplet-free InAsSbBi at a user specified growth temperature, target lattice mismatch, and target bandgap energy.

In this example, the group V flux setpoints $F_{Bi}$, $F_{Sb}$, and $F_{As}$ are predicted for droplet free InAsSbBi by the model given inputs of growth temperature, indium flux $F_{In}$, target lattice mismatch (in-plane strain) $\varepsilon_{xx}$ to the substrate, and target bandgap energy $E_g$. Droplet-free InAsSbBi growth is achieved when the excess As flux $\Delta F_{As}$ is greater than the boundary value $\Delta F_{DF}$ for droplet-free growth illustrated in FIG. 7 and given by the relation $\Delta F_{DF}(T)=18-0.04T$ (%), where T is the growth temperature. The process is similar to Example 3. The MBE grower/operator specifies the growth temperature, In flux $F_{In}$, target lattice mismatch, and target bandgap energy as inputs. Vegard's Law and the InAsSbBi bandgap bowing equation are used to calculate the group V mole fractions x, y, and z. The Bi mole fraction x is compared to the maximum achievable Bi mole fraction for droplet free growth, $x_{max}$, at the specified growth temperature and lattice mismatch as determined in Example 3 above. If the target Bi mole fraction $x \leq x_{max}$, no action is required. However, if $x \geq x_{max}$, the Bi mole fraction is capped at the value $x=x_{max}$ and the InAsSbBi composition is recalculated at the given lattice mismatch. The growth model embodied by Eqs. 3 and 4 is the used to calculate the group V fluxes, similar to Example 2. The model parameters $R_{inc}$, $R_{des}$, $R_{dro}$, $P_{exc,y}$, $P_{exc,z}$, $P_{rem,y}$, and $P_{rem,z}$ are determined either experimentally or theoretically and their values are known. The growth model outputs the group V flux setpoints $F_{Bi}$, $F_{Sb}$, and $F_{As}$ to achieve the target mole fractions. Additionally, the group V surface coverage fractions $\theta_x$, $\theta_y$, and $\theta_z$ are provided as an output. The process is illustrated schematically in FIG. 15.

Calculation of Mole Fraction Uncertainty

The mole fractions of the InAsSbBi samples are determined using photoluminescence spectroscopy measurements of bandgap energy and X-ray diffraction measurements of InAsSbBi layer lattice constant, each of which contributes to the mole fraction uncertainty. The uncertainty in the bandgap energy measurement is estimated from the low temperature width of the InAsSbBi photoluminescence spectra used to determine the bandgap energy. The significant amount of photoluminescence broadening observed in this material is primarily a result of lateral modulation in the Bi mole fraction[5] and pairing and clustering[32] of Bi atoms on the group-V sublattice sites. Therefore, the uncertainty given by the spectral width is also a measure of the range of Bi mole fractions found in the material.

The bandgap measurement uncertainty $\sigma_g$ in the Bi, Sb, and As mole fractions $x_i$, $y_i$, and $z_i$ is $$\sigma_{g,Bi} = \frac{b_w(x_i) - 3.04 \text{ meV}}{51 \text{ meV}/\% \text{ Bi}}, \tag{14a}$$

$$\sigma_{g,Sb} = \frac{3.04 \text{ meV} - 0.75 \text{ meV}}{9.3 \text{ meV}/\% \text{ Sb}}, \tag{14b}$$

$$\sigma_{g,As} = \sigma_{g,Bi} + \sigma_{g,Sb}, \tag{14c}$$

where $b_w(x_i)$ is the Bi mole fraction dependent low temperature width of photoluminescence spectra in the i-th sample due to Bi incorporation. The width of the photoluminescence spectra is quantified by the difference between the photoluminescence peak energy $E_p$ and bandgap energy $E_g$ determined from the first-derivative maximum,[1] which is provided in Table V in Ref. 1 for InAsSbBi samples grown between 400 and 430° C. The low-temperature width of the photoluminescence spectrum for Bi-free lattice-matched InAsSb grown at 430° C. is 3.04 meV,[1] which is subtracted from the larger width $b_w(x_i)$ observed when Bi mole fraction $x_i$ is present in the material. This difference is that portion of bandgap energy uncertainty due to Bi incorporation and is divided by 51 meV/% Bi,[21] which is the shift in the bandgap energy per percent Bi mole fraction.

Figure 10:
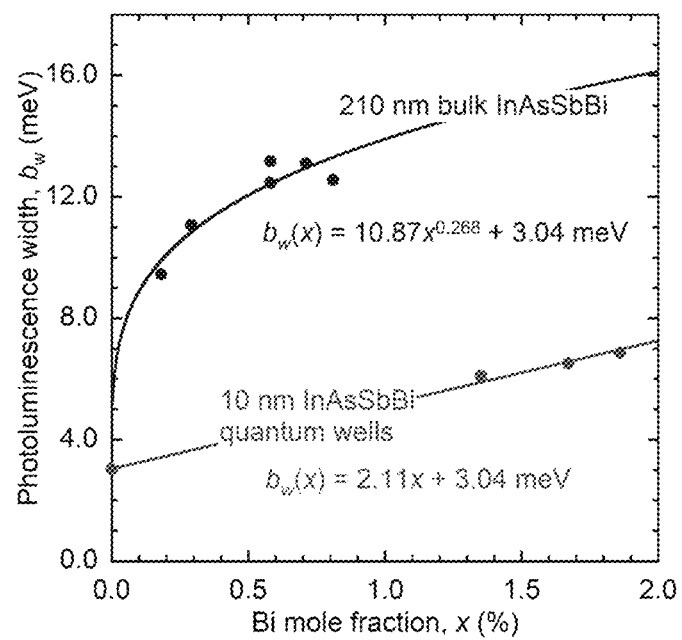
FIG. 10 shows the low-temperature photoluminescence width for 210 nm thick bulk InAsSbBi (blue circles) and 10 nm thick InAsSbBi quantum wells (red circles) from Table V in Ref 1. The plots show a power law fit to the bulk samples and a linear fit to the quantum well samples.

The photoluminescence width[1] of the 210 nm bulk samples and 10 nm quantum well samples are shown in FIG. 10 as a function of Bi mole fraction. A power law relation with amplitude of 10.87 meV and power law 0.268 is fit to the bulk samples while a linear relation with slope 2.11 meV/% Bi is fit to the quantum well samples. These fits provide the functional form for the photoluminescence width versus Bi mole fraction, $b_w(x_i)$, that is applied to the InAsSbBi samples examined in this work.

By similar logic, $\sigma_{g,Sb}$ shown in Eq. 14b is determined from the difference in the low-temperature photoluminescence widths of 3.04 meV[1] for lattice matched InAsSb grown on GaSb at 430° C. and 0.75 meV[1] for InAs grown on InAs at 450° C., divided by 9.3 meV/% Sb[18] for the bandgap energy change per percent Sb; yielding a Sb mole fraction uncertainty of $\sigma_{g,Sb}=0.25\%$. Since the Sb mole fractions examined in this work do not deviate significantly from lattice-matched value of 8.93% for InAsSb/GaSb, the uncertainty is assumed to be a constant. Finally, the uncertainty in the As mole fraction due to the bandgap energy measurement is given by the sum of the uncertainties in the Bi and Sb mole fractions in Eq. 14c.

The mole fraction uncertainty due to the lattice constant measurement, $\sigma_a$, is determined from sensitivity analysis of the dynamical simulations of coupled $\omega-2\theta$ X-ray diffraction scans from the (400) crystal plane to changes in the Bi mole fraction using the PANalytical X'Pert Epitaxy software package.[33] This uncertainty is independent of the magnitude of the Bi mole fraction and depends only on the sample structure. For example, even InAsSb bulk samples[18] with zero Bi content exhibit a degree of uncertainty in the lattice constant determination. The Bi mole fraction is varied in the simulation until the minimum resolvable change in the InAsSbBi layer peak position is observed. The uncertainty $\sigma_{a,Bi}$ is determined to be 0.1% in Bi mole fraction for the 210 nm bulk InAsSbBi bulk layers and 0.3% in Bi mole fraction for the 10 nm InAsSbBi quantum well samples.

The Sb and As mole fraction uncertainties $\sigma_{a,Sb}$ and $\sigma_{a,As}$ are related to the Bi mole fraction uncertainties $\sigma_{a,Bi}$ by Vegard's Law, which relates the Bi and Sb mole fractions x and y:[1]

$$y = \frac{a_{InAsSbBi} - a_{InAs}}{a_{InSb} - a_{InAs}} - x \frac{a_{InBi} - a_{InAs}}{a_{InSb} - a_{InAs}}, \tag{15a}$$

$$\left|\frac{dy}{dx}\right| = \frac{a_{InBi} - a_{InAs}}{a_{InSb} - a_{InAs}}. \tag{15b}$$

The Sb mole fraction uncertainty is given by:

$$\sigma_{a,Sb} = \sigma_{a,Bi}\left|\frac{dy}{dx}\right| \cong 1.31\sigma_{a,Bi}. \tag{16}$$

The As mole fraction uncertainty is given by the sum of the Sb and Bi mole fraction uncertainties:

$$\sigma_{aAs} \cong \sigma_{a,Bi} + \sigma_{a,Sb} = \sigma_{a,Bi} + \sigma_{a,Bi}\left|\frac{dy}{dx}\right| \cong 2.31\sigma_{a,Bi} \qquad (17)$$

The total uncertainty σ in the Bi, Sb, and As mole fractions is given by the squared sum of the bandgap energy and lattice constant measurement uncertainties:

$$\sigma^2 = \sigma_g^2 + \sigma_a^2. \qquad (18)$$

Figure 11:
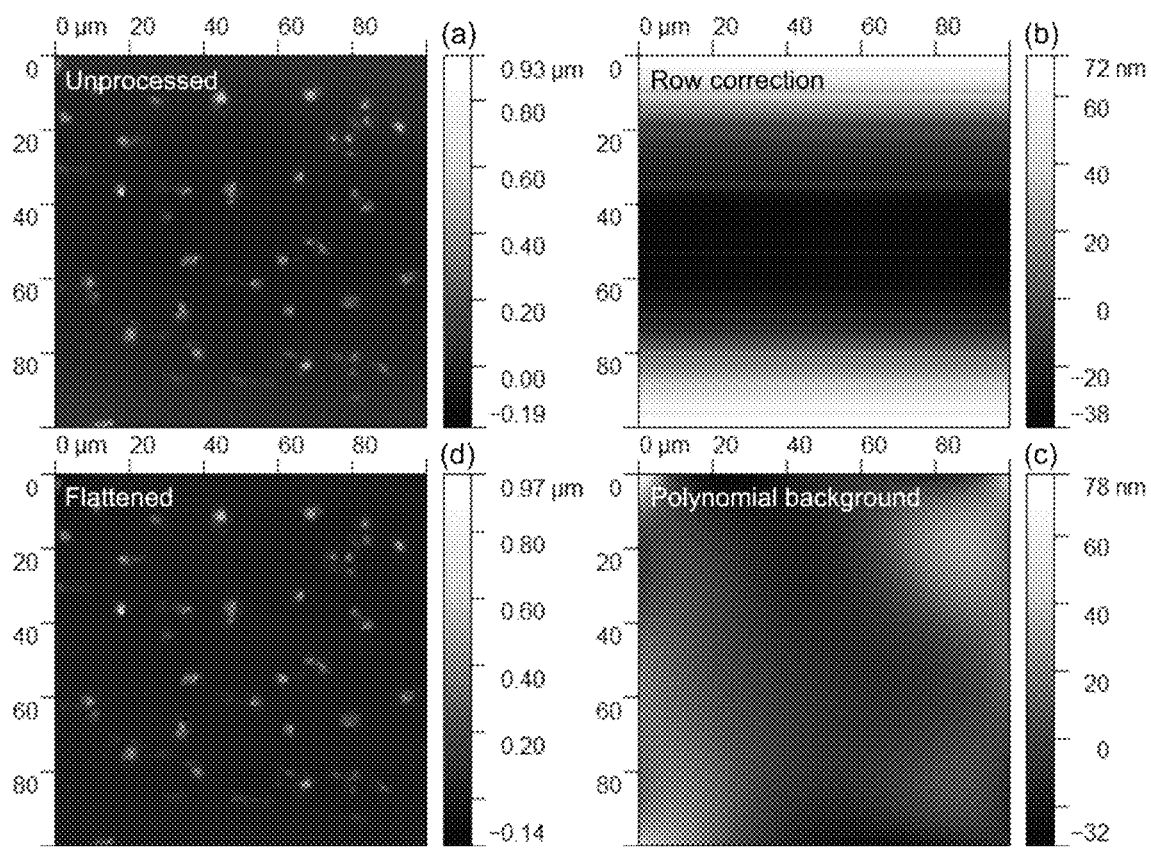
FIG. 11 illustrates the background flattening procedure for 100 μm by 100 μm atomic force microscopy images of 400° C. grown sample B with Bi/In=0.050, Sb/In=0.120, and As/In=0.911. Clockwise from upper left: (a) unprocessed AFM image, (b) row correction using "median" method, (c) 4th order polynomial background, and (d) resulting AFM image with flattened background. The planar surface of the image is uniform to within ±15 nm.

Here it is assumed that the two uncertainties are uncorrelated such that the covariance of $\sigma_a$ and $\sigma_g$ is zero. The mole fraction uncertainties due to the bandgap energy measurement, lattice constant measurement, and total uncertainty are listed below in Table VIII. The total mole fraction uncertainties for all three group V species are also reported in Table II.

features, with average diameters of approximately 2 μm or less, is unaffected by the flattening procedure. FIG. 11 shows the flattening procedure including the row correction and polynomial background for 400° C. grown sample B.

Calculation of Droplet Accumulation Rate

The total amount of In per unit area, $N_{In}$, accumulated in the surface droplets is calculated from the difference between the target and measured InAsSbBi layer thickness, $h_{diff}$, with $$N_{In} = 4\frac{h_{diff}}{a_{InAsSbBi}^3}, \qquad (19)$$

where $a_{InAsSbBi}$ is the lattice constant of the zinc-blende InAsSbBi unit cell. The volume per unit area of metallic In,

TABLE VIII

Bi, Sb, and As mole fraction uncertainties due to bandgap energy and lattice constant measurement uncertainty.

| | | | Mole fraction uncertainties (%) | | | | | | | |
|---|---|---|---|---|---|---|---|---|---|---|
| Sample | Cross section | Growth temperature (° C.) | from bandgap measurement, $\sigma_g$ | | | from lattice constant measurement, $\sigma_a$ | | | Total uncertainty, σ | | |
| | | | Bi | Sb | As | Bi | Sb | As | Bi | Sb | As |
| A | Bulk | 400 | 0.18 | 0.25 | 0.43 | 0.10 | 0.13 | 0.23 | 0.21 | 0.28 | 0.49 |
| B | Bulk | 400 | 0.19 | 0.25 | 0.44 | 0.10 | 0.13 | 0.23 | 0.22 | 0.28 | 0.50 |
| C | Bulk | 400 | 0.20 | 0.25 | 0.45 | 0.10 | 0.13 | 0.23 | 0.22 | 0.28 | 0.51 |
| D | Bulk | 400 | 0.18 | 0.25 | 0.43 | 0.10 | 0.13 | 0.23 | 0.21 | 0.28 | 0.49 |
| E | QW | 400 | 0.08 | 0.25 | 0.33 | 0.30 | 0.39 | 0.69 | 0.31 | 0.47 | 0.77 |
| F | QW | 400 | 0.07 | 0.25 | 0.32 | 0.30 | 0.39 | 0.69 | 0.31 | 0.47 | 0.76 |
| G | QW | 400 | 0.06 | 0.25 | 0.31 | 0.30 | 0.39 | 0.69 | 0.31 | 0.47 | 0.76 |
| H | Bulk | 420 | 0.15 | 0.25 | 0.40 | 0.10 | 0.13 | 0.23 | 0.18 | 0.28 | 0.46 |
| I | Bulk | 420 | 0.14 | 0.25 | 0.39 | 0.10 | 0.13 | 0.23 | 0.17 | 0.28 | 0.46 |
| J | Bulk | 420 | 0.14 | 0.25 | 0.39 | 0.10 | 0.13 | 0.23 | 0.17 | 0.28 | 0.45 |
| K | Bulk | 420 | 0.14 | 0.25 | 0.39 | 0.10 | 0.13 | 0.23 | 0.17 | 0.28 | 0.45 |
| L | Bulk | 420 | 0.14 | 0.25 | 0.39 | 0.10 | 0.13 | 0.23 | 0.18 | 0.28 | 0.46 |
| M | Bulk | 420 | 0.14 | 0.25 | 0.39 | 0.10 | 0.13 | 0.23 | 0.17 | 0.28 | 0.45 |
| N | Bulk | 420 | 0.12 | 0.25 | 0.37 | 0.10 | 0.13 | 0.23 | 0.16 | 0.28 | 0.44 |
| O | Bulk | 420 | 0.14 | 0.25 | 0.39 | 0.10 | 0.13 | 0.23 | 0.17 | 0.28 | 0.45 |
| P | Bulk | 420 | 0.15 | 0.25 | 0.40 | 0.10 | 0.13 | 0.23 | 0.18 | 0.28 | 0.46 |
| Q | Bulk | 420 | 0.16 | 0.25 | 0.41 | 0.10 | 0.13 | 0.23 | 0.19 | 0.28 | 0.47 |

AFM Flattening Procedure

The 100 μm by 100 μm images acquired by atomic force microscopy (AFM) exhibit several sources of noise including 1/f noise and row streaking due to rastering of the comparatively small AFM probe tip over the large image area. A flattening procedure is implemented in the Gwyddion software to convert the noisy sample surface into a uniform plane on which the droplet features reside. First, row correction is performed to remove horizontal streaking. The "align rows using various methods" tool is used and the "median" method is specified. Next, a two-dimensional polynomial function of $4^{th}$ order in both image axes (x and y) is fit to the AFM image using the "Remove polynomial background" tool. After row correction and polynomial background fitting, the "Level data by fitting a plane through three points" tool is used to correct for any residual tilt of the sample surface in the image. This procedure results in a flat, uniform background plane with typical tolerances of ±15 nm for the 400° C. grown samples and ±1.5 nm for the 420° C. grown samples. Detailed Fourier analysis indicates that the magnitude distortion due to the high pass filtering performed by row correction and $4^{th}$ order polynomial background flattening is negligible above 0.1 μm$^{-1}$ in frequency, or 10 μm in real space. Therefore, the amplitude of the droplet $h_{In}$, contained within the droplets is then given by the product of the In per unit area and the metallic volume associated with each In atom, $V_{In}$, with $$h_{In} = N_{In}V_{In} = N_{In}\frac{m_{In}}{\rho_{In}N_A}, \qquad (20)$$

where $m_{In}$=114.82 g/mol is the atomic mass of In,[34] $\rho_{In}$=7.31 g/cm$^3$ is the density of metallic In,[35] and $N_A$=6.0221×10$^{23}$ is Avogadro's number. Conceptually, $h_{In}$ is the thickness of a uniform layer of metallic In equal to the amount of In contained within the droplet features. The corresponding amount of metallic Bi per unit area, $N_{Bi}$, contained within the droplets is given from difference between the total droplet volume per unit area, $h_{droplet}$, and the metallic In volume per unit area $h_{In}$, with $$N_{Bi} = \frac{h_{droplet} - h_{In}}{V_{Bi}} = (h_{droplet} - h_{In})\frac{\rho_{Bi}N_A}{m_{Bi}}, \qquad (21)$$

where $m_{Bi}$=208.98 g/mol is the atomic mass of Bi[34] and $\rho_{Bi}$=9.78 g/cm$^3$ is the density of metallic Bi.[35] Finally, the measured rate of Bi accumulation in droplets, $\theta_{Bi}R_{dro}$, normalized to the In flux is given as $$\theta_{Bi}R_{dro} = \frac{N_{Bi}}{F_{In}T} = \frac{N_{Bi}}{3.696 \times 10^{17} \text{cm}^{-2}}. \quad (22)$$

The product $F_{In}T$ is $3.696 \times 10^{17}$ cm$^{-2}$ for all the 210 nm thick samples grown for a duration T of 840 s at a constant In flux $F_{In}$ of $4.4 \times 10^{14}$ cm$^{-2}$ s$^{-1}$. Table IV summarizes the droplet composition analysis and Bi droplet accumulation rates for the six droplet covered samples B, C, D, M, O, and Q.

CONCLUSIONS

A molecular beam epitaxy growth model based on the kinetics of Bi adsorption, desorption, incorporation, surface accumulation, and droplet formation is applied to the growth of nearly lattice matched InAsSbBi on GaSb. A solution for steady state growth is derived and the model parameters are fit to experimentally measured Bi, Sb, and As mole fractions for bulk and quantum well samples grown at 400° C. and 420° C. The Bi mole fractions predicted by the model agree to within uncertainty with the measured mole fractions. As the growth temperature is increased from 400° C. to 420° C., the Bi incorporation rate decreases by a factor of 3.8 and the Bi self-desorption rate increases by a factor of 1.7. The characteristic temperatures for Bi incorporation, desorption, and droplet uptake are 14.9° C., 36.8° C., and 7.9° C. respectively. The net result is a reduction in Bi incorporation at higher growth temperatures. The model indicates that the Bi surface coverage is proportional to the Bi/In flux and decreases as the As/In flux increases.

The removal of surface Bi by surface As and the exchange of incorporated Bi with surface As dominates the growth process with associated probabilities of 70% and 78% respectively. The reverse processes involving As and Bi are negligible with associated probabilities of 3.3% and 0.15% respectively. The As-assisted removal of Bi from the surface results in a reduced fraction of Bi on the surface and a reduced likelihood of Bi-rich droplet formation. Furthermore, a growth temperature dependent threshold for the excess As flux required for droplet-free InAsSbBi growth is identified as ≥2.0% and ≥1.2% for growth at 400° C. and 420° C., respectively.

The removal of surface Bi by surface Sb and the exchange of incorporated Bi with surface Sb is smaller (than that for As) with probabilities of 44% and 20% respectively. The reverse processes involving Sb and Bi are similar in size with associated probabilities of 45% and 12% respectively. As such, Sb plays a much smaller role in limiting the incorporation of Bi. The removal of surface Sb by surface As and the exchange of incorporated Sb with surface As is also significant in the growth process with associated probabilities of 66% and 21% respectively. The reverse processes involving As and Sb are smaller with associated probabilities of 7.3% and 2.7% respectively.

The model predicts that the ultimate achievable Bi mole fractions for growth of InAsSbBi lattice-matched to GaSb are 1.43% and 0.30% for growth at 400° C. and 420° C. respectively. The characteristic temperature of this ultimate Bi mole fraction limit is 12.9° C., indicating that the growth temperature must be reduced to ≤385° C. to obtain the lattice-matched ternary alloy InAs$_{0.932}$Bi$_{0.068}$ on GaSb. The growth model provides a useful tool for the design and implementation of optimized molecular beam epitaxial growth conditions for Bi-containing III-V alloys with a desired chemical composition and optical quality.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. A method to minimize bismuth-rich surface droplets in a group-III-AsSbBi alloy composition produced by molecular beam epitaxy (MBE), wherein the group-III-AsSbBi alloy composition is described by mole fractions of Bi, Sb and As, respectively x, y, and z, and surface coverages of Bi, Sb and As, respectively $\theta_{Bi}$, $\theta_{Sb}$, and $\theta_{As}$, the method comprising:

selecting MBE operator controllable inputs, said inputs including one or more of growth temperature and incident group-III, Bi, Sb and As fluxes, $F_{III}$, $F_{Bi}$, $F_{Sb}$, and $F_{As}$, or flux ratios, $F_{Bi}/F_{III}$, $F_{Sb}/F_{III}$, and $F_{As}/F_{III}$, respectively;

obtaining estimates of model growth parameters for Bi including $R_{des,Bi}$, $R_{inc,Bi}$, $R_{dro,Bi}$, $P_{exc,Sb}$, $P_{exc,As}$, $P_{rem,Sb}$, and $P_{rem,As}$ and estimates of model growth parameters for Sb including $R_{des,Sb}$, $R_{inc,Sb}$, $R_{dro,Sb}$, $P_{exc,Bi}$, $P_{exc,As}$, $P_{rem,Bi}$, and $P_{rem,As}$ and estimates of model growth parameters for As including $R_{des,As}$, $R_{inc,As}$, $R_{dro,As}$, $P_{exc,Bi}$, $P_{exc,Sb}$, $P_{rem,Bi}$, and $P_{rem,Sb}$;

calculating experimentally derived inputs, including the Bi, Sb and As mole fractions, x, y, and z, of the alloys and the excess flux ratios for Bi, Sb and As, $\Delta F_{Bi}$, $\Delta F_{Sb}$ and $\Delta F_{As}$, respectively;

performing iterative calculations using equations 3 and 4, or equation 4a and the corresponding equations for $\theta_{Sb}$ and mole fraction y by transposing components for y in place of x and vice-versa in the equations; and corresponding equations for $\theta_{As}$ and mole fraction z by transposing components for z in place of x, to calculate mole fractions of Bi, Sb and As, x, y, and z, respectively, and surface coverages of Bi, Sb and As, respectively, $\theta_{Bi}$, $\theta_{Sb}$ and $\theta_{As}$; and mapping a variety of potential input parameters to projected resulting As, Sb and Bi mole fractions, x, y, and z and surface coverages, $\theta_x$, $\theta_y$ and $\theta_z$, using the iterative calculations, in order to identify conditions that minimize the formation of surface droplets, which conditions include maintaining the excess flux ratio of As, $\Delta F_{As}$, above the minimum excess As flux, $\Delta F_{DF}$, required for droplet free growth at the specified growth temperature;

wherein equations 3, 4 and 4a are given by:

$$\theta_{Bi} = \frac{F_{Bi}(F_{III} + F_{As}P_{exc,As} + F_{Sb}P_{exc,Sb})}{(F_{III} + F_{As}P_{exc,As} + F_{Sb}P_{exc,Sb})(R_{des,Bi} + R_{dro,Bi} + \Delta F_{As}P_{rem,As} + \Delta F_{Sb}P_{rem,Sb}) + F_{III}R_{inc,Bi}} \quad (3)$$

$$x = \frac{\theta_{Bi}R_{inc,Bi}}{(F_{III} + F_{As}P_{exc,As} + F_{Sb}P_{exc,Sb})}, \quad (4)$$

-continued $$= \frac{F_{Bi}R_{inc,Bi}}{(R_{des,Bi} + R_{dro,Bi} + \Delta F_{As}P_{rem,As} + \Delta F_{Sb}P_{rem,Sb}) + F_{III}R_{inc,Bi}}. \quad (4a)$$

where $R_{des,Bi}$, $R_{inc,Bi}$ and $R_{dro,Bi}$ are the rates of self-desorption, incorporation and droplet accumulation, respectively, for Bi;

$R_{des,Sb}$ and $R_{inc,Sb}$ are the rates of self-desorption and incorporation respectively, for Sb;

$R_{des,As}$ and $R_{inc,As}$ are the rates of self-desorption and incorporation respectively, for As;

$P_{exc,Sb}$ and $P_{exc,As}$ are the probability that an atom of Sb or As, respectively, displaces an atom of Bi back into the surface layer;

$P_{exc,Bi}$ and $P_{exc,As}$ are the probability that an atom of Bi or As, respectively, displaces an atom of Sb back into the surface layer;

$P_{exc,Bi}$ and $P_{exc,Sb}$ are the probability that an atom of Bi or Sb, respectively, displaces an atom of As back into the surface layer;

$P_{rem,Sb}$ and $P_{rem,As}$ are the probability of anion-assisted removal of an atom of Bi by an atom of element Sb or As, respectively;

$P_{rem,Bi}$ and $P_{rem,As}$ are the probability of anion-assisted removal of an atom of Sb by an atom of element Bi or As, respectively; and $P_{rem,Bi}$ and $P_{rem,Sb}$ are the probability of anion-assisted removal of an atom of element As by an atom of element Bi or Sb, respectively; and producing a group-III-AsSbBi alloy composition by molecular beam epitaxy (MBE) using the identified conditions.

2. The method of claim 1, wherein the step of obtaining estimates of the model parameters in the obtaining step comprises performing a plurality of MBE growths of multiple group-III-AsSbBi alloy compositions using operator controllable inputs, and measuring droplet accumulation rate, $\theta_x R_{dro,x}$, for each of the MBE growths that exhibits surface droplet formation of Bi.

3. The method of claim 1, wherein the step of obtaining estimates of the model parameters in the obtaining step comprises performing a plurality of MBE growths of group-III-AsSbBi alloy compositions using operator controllable inputs, and performing experimental determination of alloy lattice constants and band gap energies for each of the plurality of MBE growths.

4. The method of claim 3 wherein the step of performing the experimental determination of alloy lattice constants for each growth is ascertained, at least for some portion of the As, Sb and Bi elements, from X-ray diffraction measurements.

5. The method of claim 3 wherein the step of performing the experimental determination of band gap energies for each growth is ascertained, at least for some portion of the As, Sb and Bi elements, from steady state photoluminescence spectroscopy measurements.

6. The method of claim 1, wherein the step of performing the experimental determination of measured droplet accumulation rate, $\theta_x R_{dro}$, for each growth is ascertained, at least for some portion of As, Sb and Bi, from X-ray diffraction measurements of growth layer thickness.

7. The method of claim 1, wherein the excess flux ratios for the As, Sb and Bi are calculated as the difference between the incident As, Sb and Bi flux ratios and the As, Sb and Bi mole fractions x, y, and z of the alloys.

8. The method of claim 1, wherein the growth temperature is 400° C.; and wherein the following parameters have the following definitions:

$R_{des,Bi}$=0.3992 relative to In flux;
$R_{inc,Bi}$=0.1246 relative to In flux;
$R_{dro,Bi}$=0.0669 relative to In flux;
$R_{des,Sb}$=0.1078 relative to In flux;
$R_{inc,Sb}$=0.7975 relative to In flux;
$R_{des,As}$=0.0242 relative to In flux;
$R_{inc,As}$=1.3891 relative to In flux;
$P_{exc,Sb}$ of bismuth=0.2019
$P_{exc,As}$ of bismuth=0.7816
$P_{exc,Bi}$ of antimony=0.1185;
$P_{exc,As}$ of antimony=0.2125;
$P_{exc,Bi}$ of arsenic=0.0015;
$P_{exc,Sb}$ of arsenic=0.0265;
$P_{rem,Sb}$ of bismuth=0.4381;
$P_{rem,As}$ of bismuth=0.7013;
$P_{rem,Bi}$ of antimony=0.4501;
$P_{rem,As}$ of antimony=0.6567;
$P_{rem,Bi}$ of arsenic=0.0333; and
$P_{rem,Sb}$ of arsenic=0.0732.

* * * * *